(12) United States Patent
Walsh et al.

(10) Patent No.: US 8,487,639 B1
(45) Date of Patent: Jul. 16, 2013

(54) RECEIVE DEMODULATOR FOR CAPACITIVE SENSING

(75) Inventors: Paul Walsh, Cork (IE); Zheyao Zhang, Cork (IE); Viktor Kremin, Lviv (UA)

(73) Assignee: Cypress Semiconductor Corporation, San Jose, CA (US)

( * ) Notice: Subject to any disclaimer, the term of this patent is extended or adjusted under 35 U.S.C. 154(b) by 555 days.

(21) Appl. No.: 12/623,661

(22) Filed: Nov. 23, 2009

Related U.S. Application Data

(60) Provisional application No. 61/117,031, filed on Nov. 21, 2008.

(51) Int. Cl.
*G01R 27/26* (2006.01)

(52) U.S. Cl.
USPC .......................................... 324/679; 324/658

(58) Field of Classification Search
USPC .................................. 324/658, 679
See application file for complete search history.

(56) References Cited

U.S. PATENT DOCUMENTS

| | | |
|---|---|---|
| 4,039,940 A | 8/1977 | Butler et al. |
| 4,145,748 A | 3/1979 | Eichelberger et al. |
| 4,264,903 A | 4/1981 | Bigelow |
| 4,283,713 A | 8/1981 | Philipp |
| 4,293,734 A | 10/1981 | Pepper, Jr. |
| 4,438,404 A | 3/1984 | Philipp |
| 4,475,151 A | 10/1984 | Philipp |
| 4,497,575 A | 2/1985 | Philipp |
| 4,614,937 A | 9/1986 | Poujois |
| 4,728,932 A | 3/1988 | Atherton |
| 4,736,097 A | 4/1988 | Philipp |
| 4,736,191 A | 4/1988 | Matzke et al. |
| 4,742,331 A | 5/1988 | Barrow et al. |
| 4,772,983 A | 9/1988 | Kerber et al. |
| 4,773,024 A | 9/1988 | Faggin et al. |
| 4,802,103 A | 1/1989 | Faggin et al. |
| 4,825,147 A | 4/1989 | Cook et al. |
| 4,876,534 A | 10/1989 | Mead et al. |
| 4,879,461 A | 11/1989 | Philipp |
| 4,879,505 A | 11/1989 | Barrow et al. |
| 4,920,399 A | 4/1990 | Hall |
| 4,935,702 A | 6/1990 | Mead et al. |
| 4,940,980 A | 7/1990 | Tice |
| 4,953,928 A | 9/1990 | Anderson et al. |
| 4,962,342 A | 10/1990 | Mead et al. |
| 5,049,758 A | 9/1991 | Mead et al. |
| 5,055,719 A | 10/1991 | Hughes |
| 5,055,827 A | 10/1991 | Philipp |
| 5,059,920 A | 10/1991 | Anderson et al. |
| 5,068,622 A | 11/1991 | Mead et al. |

(Continued)

FOREIGN PATENT DOCUMENTS

WO  WO2007128682 A1  11/2007

OTHER PUBLICATIONS

"CSD User Module Data Sheet," CSD v1.0, Oct. 23, 2006; 58 pages.

(Continued)

*Primary Examiner* — Jeff Natalini

(57) ABSTRACT

A charge storage circuit stores charge from a current induced across a capacitive sensing device. The current across the capacitive sensing device is supplied to the charge storage circuit by a current conveying device to generate an output voltage signal. The presence of a conductive object proximate to the capacitive sensing device is detected based on the output voltage signal.

20 Claims, 9 Drawing Sheets

U.S. PATENT DOCUMENTS

| | | | |
|---|---|---|---|
| 5,073,759 A | 12/1991 | Mead et al. | |
| 5,083,044 A | 1/1992 | Mead et al. | |
| 5,095,284 A | 3/1992 | Mead | |
| 5,097,305 A | 3/1992 | Mead et al. | |
| 5,107,149 A | 4/1992 | Platt et al. | |
| 5,109,261 A | 4/1992 | Mead et al. | |
| 5,119,038 A | 6/1992 | Anderson et al. | |
| 5,120,996 A | 6/1992 | Mead et al. | |
| 5,122,800 A | 6/1992 | Philipp | |
| 5,126,685 A | 6/1992 | Platt et al. | |
| 5,146,106 A | 9/1992 | Anderson et al. | |
| 5,160,899 A | 11/1992 | Anderson et al. | |
| 5,165,054 A | 11/1992 | Platt et al. | |
| 5,166,562 A | 11/1992 | Allen et al. | |
| 5,204,549 A | 4/1993 | Platt et al. | |
| 5,243,554 A | 9/1993 | Allen et al. | |
| 5,248,873 A | 9/1993 | Allen et al. | |
| 5,260,592 A | 11/1993 | Mead et al. | |
| 5,270,963 A | 12/1993 | Allen et al. | |
| 5,276,407 A | 1/1994 | Mead et al. | |
| 5,281,862 A | 1/1994 | Ma | |
| 5,289,023 A | 2/1994 | Mead | |
| 5,294,889 A | 3/1994 | Heep et al. | |
| 5,303,329 A | 4/1994 | Mead et al. | |
| 5,305,017 A | 4/1994 | Gerpheide | |
| 5,323,158 A | 6/1994 | Ferguson, Jr. | |
| 5,324,958 A | 6/1994 | Mead et al. | |
| 5,331,215 A | 7/1994 | Allen et al. | |
| 5,336,936 A | 8/1994 | Allen et al. | |
| 5,339,213 A | 8/1994 | O'Callaghan | |
| 5,349,303 A | 9/1994 | Gerpheide | |
| 5,374,787 A | 12/1994 | Miller et al. | |
| 5,381,515 A | 1/1995 | Platt et al. | |
| 5,384,467 A | 1/1995 | Plimon et al. | |
| 5,408,194 A | 4/1995 | Steinbach et al. | |
| 5,412,387 A | 5/1995 | Vincelette et al. | |
| 5,488,204 A | 1/1996 | Mead et al. | |
| 5,495,077 A | 2/1996 | Miller et al. | |
| 5,541,600 A | 7/1996 | Blumenkrantz et al. | |
| 5,541,878 A | 7/1996 | Lemoncheck et al. | |
| 5,543,588 A | 8/1996 | Bisset et al. | |
| 5,543,590 A | 8/1996 | Gillespie et al. | |
| 5,543,591 A | 8/1996 | Gillespie et al. | |
| 5,555,907 A | 9/1996 | Philipp | |
| 5,565,658 A | 10/1996 | Gerpheide et al. | |
| 5,566,702 A | 10/1996 | Philipp | |
| 5,572,205 A | 11/1996 | Caldwell et al. | |
| 5,629,629 A * | 5/1997 | Tielert et al. | 324/679 |
| 5,629,891 A | 5/1997 | Lemoncheck et al. | |
| 5,648,642 A | 7/1997 | Miller et al. | |
| 5,672,959 A | 9/1997 | Der | |
| 5,682,032 A | 10/1997 | Philipp | |
| 5,684,487 A | 11/1997 | Timko | |
| 5,730,165 A | 3/1998 | Philipp | |
| 5,757,368 A | 5/1998 | Gerpheide et al. | |
| 5,760,852 A | 6/1998 | Wu et al. | |
| 5,763,909 A | 6/1998 | Mead et al. | |
| 5,763,924 A | 6/1998 | Lum et al. | |
| 5,767,457 A | 6/1998 | Gerpheide et al. | |
| 5,796,183 A | 8/1998 | Hourmand et al. | |
| 5,801,340 A | 9/1998 | Peter | |
| 5,812,698 A | 9/1998 | Platt et al. | |
| 5,841,078 A | 11/1998 | Miller et al. | |
| 5,844,256 A | 12/1998 | Higashino | |
| 5,854,625 A | 12/1998 | Frisch et al. | |
| 5,861,583 A | 1/1999 | Schediwy et al. | |
| 5,861,875 A | 1/1999 | Gerpheide | |
| 5,864,242 A | 1/1999 | Allen et al. | |
| 5,864,392 A | 1/1999 | Winklhofer et al. | |
| 5,880,411 A | 3/1999 | Gillespie et al. | |
| 5,889,236 A | 3/1999 | Gillespie et al. | |
| 5,914,465 A | 6/1999 | Allen et al. | |
| 5,914,708 A | 6/1999 | Lagrange et al. | |
| 5,920,309 A | 7/1999 | Bisset et al. | |
| 5,920,310 A | 7/1999 | Faggin et al. | |
| 5,926,566 A | 7/1999 | Wang et al. | |
| 5,942,733 A | 8/1999 | Allen et al. | |
| 5,943,052 A | 8/1999 | Allen et al. | |
| 5,969,513 A | 10/1999 | Clark | |
| 6,023,422 A | 2/2000 | Allen et al. | |
| 6,028,271 A | 2/2000 | Gillespie et al. | |
| 6,028,959 A | 2/2000 | Wang et al. | |
| 6,097,432 A | 8/2000 | Mead et al. | |
| 6,148,104 A | 11/2000 | Wang et al. | |
| 6,151,967 A | 11/2000 | McIntosh et al. | |
| 6,185,450 B1 | 2/2001 | Seguine et al. | |
| 6,188,228 B1 | 2/2001 | Philipp | |
| 6,188,391 B1 | 2/2001 | Seely et al. | |
| 6,191,723 B1 | 2/2001 | Lewis | |
| 6,211,743 B1 * | 4/2001 | Rhee et al. | 331/34 |
| 6,222,528 B1 | 4/2001 | Gerpheide et al. | |
| 6,239,389 B1 | 5/2001 | Allen et al. | |
| 6,249,447 B1 | 6/2001 | Boylan et al. | |
| 6,262,717 B1 | 7/2001 | Donohue et al. | |
| 6,271,719 B1 | 8/2001 | Sevastopoulos | |
| 6,271,720 B1 | 8/2001 | Sevastopoulos | |
| 6,280,391 B1 | 8/2001 | Olson et al. | |
| 6,288,707 B1 | 9/2001 | Philipp | |
| 6,304,014 B1 | 10/2001 | England et al. | |
| 6,320,184 B1 | 11/2001 | Winklhofer et al. | |
| 6,323,846 B1 | 11/2001 | Westerman et al. | |
| 6,326,859 B1 | 12/2001 | Goldman et al. | |
| 6,342,817 B1 | 1/2002 | Crofts et al. | |
| 6,344,773 B1 | 2/2002 | Sevastopoulos et al. | |
| 6,353,200 B1 | 3/2002 | Schwankhart | |
| 6,366,099 B1 | 4/2002 | Reddi | |
| 6,377,009 B1 | 4/2002 | Philipp | |
| 6,380,929 B1 | 4/2002 | Platt | |
| 6,380,931 B1 | 4/2002 | Gillespie et al. | |
| 6,414,671 B1 | 7/2002 | Gillespie et al. | |
| 6,430,305 B1 | 8/2002 | Decker | |
| 6,441,073 B1 | 8/2002 | Tanaka et al. | |
| 6,441,682 B1 | 8/2002 | Vinn et al. | |
| 6,445,257 B1 | 9/2002 | Cox et al. | |
| 6,452,514 B1 * | 9/2002 | Philipp | 341/33 |
| 6,457,355 B1 | 10/2002 | Philipp | |
| 6,459,321 B1 | 10/2002 | Belch | |
| 6,466,036 B1 | 10/2002 | Philipp | |
| 6,473,069 B1 | 10/2002 | Gerpheide | |
| 6,489,899 B1 | 12/2002 | Ely et al. | |
| 6,498,720 B2 | 12/2002 | Glad | |
| 6,499,359 B1 | 12/2002 | Washeleski et al. | |
| 6,522,083 B1 | 2/2003 | Roach | |
| 6,522,128 B1 | 2/2003 | Ely et al. | |
| 6,522,187 B1 | 2/2003 | Sousa | |
| 6,523,416 B2 | 2/2003 | Takagi et al. | |
| 6,534,970 B1 | 3/2003 | Ely et al. | |
| 6,535,200 B2 | 3/2003 | Philipp | |
| 6,570,557 B1 | 5/2003 | Westerman et al. | |
| 6,587,093 B1 | 7/2003 | Shaw et al. | |
| 6,610,936 B2 | 8/2003 | Gillespie et al. | |
| 6,614,313 B2 | 9/2003 | Crofts et al. | |
| 6,624,640 B2 | 9/2003 | Lund et al. | |
| 6,639,586 B2 | 10/2003 | Gerpheide | |
| 6,642,857 B1 | 11/2003 | Schediwy et al. | |
| 6,649,924 B1 | 11/2003 | Philipp et al. | |
| 6,667,740 B2 | 12/2003 | Ely et al. | |
| 6,673,308 B2 | 1/2004 | Hino et al. | |
| 6,677,932 B1 | 1/2004 | Westerman | |
| 6,680,731 B2 | 1/2004 | Gerpheide et al. | |
| 6,683,462 B2 | 1/2004 | Shimizu | |
| 6,704,005 B2 | 3/2004 | Kato et al. | |
| 6,705,511 B1 | 3/2004 | Dames et al. | |
| 6,714,817 B2 | 3/2004 | Daynes et al. | |
| 6,730,863 B1 | 5/2004 | Gerpheide et al. | |
| 6,750,852 B2 | 6/2004 | Gillespie et al. | |
| 6,774,644 B2 | 8/2004 | Eberlein | |
| 6,788,221 B1 | 9/2004 | Ely et al. | |
| 6,788,521 B2 | 9/2004 | Nishi | |
| 6,798,218 B2 | 9/2004 | Kasperkovitz | |
| 6,809,275 B1 | 10/2004 | Cheng et al. | |
| 6,856,433 B2 | 2/2005 | Hatano et al. | |
| 6,859,159 B2 | 2/2005 | Michalski | |
| 6,873,203 B1 | 3/2005 | Latham et al. | |
| 6,879,215 B1 | 4/2005 | Roach | |
| 6,888,536 B2 | 5/2005 | Westerman et al. | |
| 6,888,538 B2 | 5/2005 | Ely et al. | |

| | | |
|---|---|---|
| 6,893,724 B2 | 5/2005 | Lin et al. |
| 6,903,402 B2 | 6/2005 | Miyazawa |
| 6,904,570 B2 | 6/2005 | Foote et al. |
| 6,914,547 B1 | 7/2005 | Swaroop et al. |
| 6,933,873 B1 | 8/2005 | Horsley et al. |
| 6,949,811 B2 | 9/2005 | Miyazawa |
| 6,958,594 B2 | 10/2005 | Redl et al. |
| 6,969,978 B2 | 11/2005 | Dening |
| 6,970,120 B1 | 11/2005 | Bjornsen |
| 6,970,126 B1 | 11/2005 | O'Dowd et al. |
| 6,975,123 B1 | 12/2005 | Malang et al. |
| 6,993,607 B2 | 1/2006 | Philipp |
| 7,030,782 B2 | 4/2006 | Ely et al. |
| 7,031,886 B1 | 4/2006 | Hargreaves |
| 7,032,051 B2 | 4/2006 | Reay et al. |
| 7,046,230 B2 | 5/2006 | Zadesky et al. |
| 7,078,916 B2 | 7/2006 | Denison |
| 7,109,978 B2 | 9/2006 | Gillespie et al. |
| 7,119,550 B2 | 10/2006 | Kitano et al. |
| 7,129,935 B2 | 10/2006 | Mackey |
| 7,133,140 B2 | 11/2006 | Lukacs et al. |
| 7,133,793 B2 | 11/2006 | Ely et al. |
| 7,141,968 B2 | 11/2006 | Hibbs et al. |
| 7,141,987 B2 | 11/2006 | Hibbs et al. |
| 7,148,704 B2 | 12/2006 | Philipp |
| 7,151,528 B2 | 12/2006 | Taylor et al. |
| 7,183,851 B2 | 2/2007 | Song |
| 7,212,189 B2 | 5/2007 | Shaw et al |
| 7,235,983 B2 | 6/2007 | O'Dowd et al. |
| 7,253,643 B1 | 8/2007 | Seguine |
| 7,262,609 B2 | 8/2007 | Reynolds |
| 7,288,946 B2 | 10/2007 | Hargreaves et al. |
| 7,288,977 B2 | 10/2007 | Stanley |
| 7,298,124 B2 | 11/2007 | Kan et al. |
| 7,301,350 B2 | 11/2007 | Hargreaves et al. |
| 7,315,793 B2 | 1/2008 | Jean |
| 7,339,580 B2 | 3/2008 | Westerman et al. |
| 7,417,411 B2 | 8/2008 | Hoffman et al. |
| 7,417,441 B2 | 8/2008 | Reynolds |
| 7,423,437 B2 | 9/2008 | Hargreaves et al. |
| 7,449,895 B2 | 11/2008 | Ely et al. |
| 7,450,113 B2 | 11/2008 | Gillespie et al. |
| 7,451,050 B2 | 11/2008 | Hargreaves |
| 7,453,270 B2 | 11/2008 | Hargreaves et al. |
| 7,453,279 B2 | 11/2008 | Corbin, Jr. et al. |
| 7,466,307 B2 | 12/2008 | Trent, Jr. et al. |
| 7,499,040 B2 | 3/2009 | Zadesky et al. |
| 7,521,941 B2 | 4/2009 | Ely et al. |
| 7,663,607 B2 | 2/2010 | Hotelling et al. |
| 7,683,641 B2 | 3/2010 | Hargreaves et al. |
| 7,724,001 B2 | 5/2010 | Kleven |
| 2001/0008478 A1 | 7/2001 | McIntosh et al. |
| 2001/0020850 A1 | 9/2001 | Mcintosh et al. |
| 2002/0063688 A1 | 5/2002 | Shaw et al. |
| 2002/0180464 A1* | 12/2002 | Tartagni ............ 324/687 |
| 2002/0191029 A1 | 12/2002 | Gillespie et al. |
| 2003/0062889 A1 | 4/2003 | Ely et al. |
| 2003/0080755 A1 | 5/2003 | Kobayashi |
| 2003/0090277 A1 | 5/2003 | Lechner et al. |
| 2004/0178989 A1 | 9/2004 | Shahoian et al. |
| 2005/0024341 A1 | 2/2005 | Gillespie et al. |
| 2005/0040833 A1* | 2/2005 | Yakabe et al. ............ 324/686 |
| 2005/0122119 A1 | 6/2005 | Barlow |
| 2006/0001490 A1 | 1/2006 | Song |
| 2006/0032680 A1 | 2/2006 | Elias et al. |
| 2006/0038793 A1 | 2/2006 | Philipp |
| 2006/0066582 A1 | 3/2006 | Lyon et al. |
| 2006/0071674 A1 | 4/2006 | Jean |
| 2006/0097991 A1 | 5/2006 | Hotelling et al. |
| 2006/0138574 A1 | 6/2006 | Saito et al. |
| 2006/0273804 A1 | 12/2006 | Delorme et al. |
| 2007/0227253 A1 | 10/2007 | Kleven |
| 2007/0257894 A1 | 11/2007 | Philipp |
| 2007/0268273 A1 | 11/2007 | Westerman et al. |
| 2007/0268274 A1 | 11/2007 | Westerman et al. |
| 2007/0268275 A1 | 11/2007 | Westerman et al. |
| 2008/0041639 A1 | 2/2008 | Westerman et al. |
| 2008/0041640 A1 | 2/2008 | Gillespie et al. |
| 2008/0042986 A1 | 2/2008 | Westerman et al. |
| 2008/0042987 A1 | 2/2008 | Westerman et al. |
| 2008/0042988 A1 | 2/2008 | Westerman et al. |
| 2008/0042989 A1 | 2/2008 | Westerman et al. |
| 2008/0042994 A1 | 2/2008 | Gillespie et al. |
| 2008/0048997 A1 | 2/2008 | Gillespie et al. |
| 2008/0068100 A1 | 3/2008 | Goodnow et al. |
| 2008/0085720 A1 | 4/2008 | Hirano et al. |
| 2008/0088602 A1 | 4/2008 | Hotelling |
| 2008/0111714 A1 | 5/2008 | Kremin |
| 2008/0116904 A1 | 5/2008 | Reynolds et al. |
| 2008/0128182 A1 | 6/2008 | Westerman et al. |
| 2008/0162996 A1 | 7/2008 | Krah et al. |
| 2008/0278178 A1 | 11/2008 | Philipp |
| 2009/0008161 A1 | 1/2009 | Jones et al. |
| 2009/0009491 A1 | 1/2009 | Grivina |
| 2009/0058802 A1 | 3/2009 | Orsley |
| 2009/0096757 A1 | 4/2009 | Hotelling et al. |
| 2009/0160461 A1 | 6/2009 | Zangl et al. |
| 2009/0224776 A1* | 9/2009 | Keith ............ 324/686 |
| 2009/0315258 A1 | 12/2009 | Wallace et al. |
| 2010/0060622 A1 | 3/2010 | Van Der Spiegel et al. |
| 2010/0201382 A1 | 8/2010 | Welland |
| 2010/0219846 A1 | 9/2010 | Dubery |
| 2011/0007021 A1 | 1/2011 | Bernstein et al. |
| 2011/0025629 A1 | 2/2011 | Grivna et al. |

OTHER PUBLICATIONS

"Sigma-Delta ADCs and DACs, AN-283 Application Note, Analog Devices," 1993; Downloaded from <http://www.analog.com/UpoloadedFiles/Application_Notes/292524291525717245054923680458171AN283.pdf>; 16 pages.

A. Fabre, "Third-Generation Current Conveyor: a New Helpful Active Element," Electronics Letters, vol. 31, No. 5, Mar. 1995, pp. 338-339; 2 pages.

Adisak Monopapassorn, "CMOS High Frequency/Low Voltage Full-Wave Rectifier," Thammasat International Journal of Science and Technology, vol. 8, No. 2, Apr.-Jun. 2003; 11 pages.

Ahmed M. Soliman, "Generation of Current Conveyor-Based All-Pass Filters from Op Amp-Based Circuits," IEEE Transactions on Circuits and Systems II: Analog and Digital Signal Processing, vol. 44, No. 4, Apr. 1997, pp. 324-330; 7 pages.

U.S. Appl. No. 12/507,614: "Multi-Functional Capacitance Sensing Circuit With a Current Conveyor," Viktor Kremin, filed on Jul. 22, 2009; 56 pages.

U.S. Appl. No. 13/185,447: "Capacitance Sensing Systems, Circuits and Methods That Include Current Conveyor Based Oscillators," Andriy Maharyta, filed on Jul. 18, 2011; 58 pages.

U.S. Appl. No. 13/249,514: "Active Integrator for a Capacitive Sense Array," Paul Walsh, filed on Sep. 30, 2011; 46 pages.

Assi et al., "An Offset Compensated and High-Gain CMOS Current-Feedback Op-Amp," IEEE Transactions on Circuits and Systems I: Fundamental Theory and Applications, vol. 45, No. 1, Jan. 1998, pp. 85-90; 6 pages.

Calvo et al., "Novel High Performance CMOS Current Conveyor," Microelectronics Reliability, Mar. 2003, pp. 955-961; 7 pages.

Cataldo et al., "Active Capacitance Multipliers Using Current Conveyors," Proceedings of the 1998 IEEE International Symposium on Circuits and Systems, vol. 2, Jun. 1998, pp. 343-346; 4 pages.

Chapweske, Adam; "The PS/2 Mouse Interface," PS/2 Mouse Interfacing, 2001, retrieved on May 18, 2006; 11 pages.

Cypress Semiconductor Corporation, "CY8C21x34 Data Sheet," CSR User Module, CSR V.1.0; Oct. 6, 2005; 36 pages.

Cypress Semiconductor Corporation, "Cypress Introduces PSoC(TM)-Based Capacitive Touch Sensor Solution," Cypress Press Release; May 31, 2005; <http://www.cypress.com/portal/server>; retrieved on Feb. 5, 2007; 4 pages.

Cypress Semiconductor Corporation, "Fan Controller CG6457AM and CG6462AM," PSoC Mixed Signal Array Preliminary Data Sheet; May 24, 2005; 25 pages.

Cypress Semiconductor Corporation, "PSoC CY8C20x34 Technical Reference Manual (TRM)," PSoC CY8C20x34 TRM, Version 1.0, 2006; 218 pages.

Cypress Semiconductor Corporation, "PSoC Mixed-Signal Controllers," Production Description; <http://www.cypress.com/portal/server>; retrieved on Sep. 27, 2005; 2 pages.

Cypress Semiconductor Corporation, "Release Notes sm017," Jan. 24, 2007; 3 pages.

Dave Van Ess, "Understanding Switched Capacitor Analog Blocks," Application Note AN2041, Mar. 30, 2004; 16 pages.

Dennis Seguine, "Capacitive Switch Scan," AN2233a, Application Note, CY8C21x34, Apr. 7, 2005; 6 pages.

Elwan et al., "Low-Voltage Low-Power CMOS Current Conveyors," IEEE Transactions on Circuits and System I: Fundamental Theory and Applications, vol. 44, No. 9, Sep. 1997; pp. 828-835; 8 pages.

Ibrahim et al., "A CMOS Realization of Inverting Second Generation Current Conveyor 'Positive' (ICCII+)," the Norwegian Signal Processing Society and IEEE 5th Nordic Signal Processing Symposium, Oct. 2002; 4 pages.

Ibrahime et al., "A New Voltage Scaling Type Digital-Analog Converter Using Only DDCCS," 3rd International Conference on Electrical and Electronics Engineering, 2003; 4 pages.

Imazeki et al., "Low-Voltage, Low-Power, Second-Generation Current Conveyors," Electrical Engineering in Japan, vol. 138, No. 2, Nov. 2001, pp. 41-48; 8 pages.

International Search Report and Written Opinion for Application No. PCT/US11/67153 dated Apr. 24, 2012; 8 pages.

International Search Report for International Application No. PCT/US10/28943 mailed on Sep. 7, 2010; 2 pages.

International Written Opinion for International Application No. PCT/US10/28943 mailed on Sep. 7, 2010; 5 pages.

James Quan, "CMOS Programmable Gain Circuits: Amplifiers and Current Conveyors," The University of Calgary, Aug. 2005; 141 pages.

Kayed et al., "VLSI Design and Implementation of CMOS Current Conveyors," The Eleventh International Conference on Microelectronics, Nov. 1999, pp. 55-57; 3 pages.

Kimmo Koli, "CMOS Current Amplifiers: Speed versus Nonlinearity," Dissertation, Nov. 2000; 305 pages.

L. Grigorescu, "Amplifiers Built with Current-Conveyors," Sep. 2006, pp. 105-109; 5 pages.

Lee, Mark; "EMC Design Considerations for PSoC CapSense Applications," Cypress Semiconductor Corporation, Application Note AN2318; Sep. 16, 2005; 6 pages.

Madian et al., "New 1.5-V CMOS Second Generation Current Conveyor Based on Wide Range Transconductor," Analog Integrated Circuits and Signal Processing, Springer Netherlands, Sep. 2006, pp. 267-279; 13 pages.

Mahmoud et al., "Low-Voltage CMOS Current Feedback Operational Amplifier and Its Application," ETRI Journal, vol. 29, No. 2, Apr. 2007, pp. 212-218; 7 pages.

Maitreechit et al., "A Full-Wave Rectifier Using a Current Conveyor and Current Mirrors with Improved Efficiency," Thammasat International Journal of Science and Technology, vol. 10, No. 2, Apr.-Jun. 2005, pp. 21-27; 7 pages.

Mark Lee, "CapSense Best Practices," Cypress Semiconductor Application Note, Oct. 16, 2006; 10 pages.

Mark Lee, "The art of capacitive tough sensing", Cypress Perform, Published in Embedded.com (http://www.embedded.com), Mar. 2007, pp. 1-10.

Masciotti et al., "CMOS Current-Mode Analog Circuit Building Blocks for RF DC-DC Converter Controllers," Proceedings of the 2003 International Symposium on Circuits and Systems, May 2003, vol. 3, pp. 455-458; 4 pages.

Maundy et al., "A New Configuration for Current Feedback Operational Amplifiers," The 2002 45th Midwest Symposium on Circuits and Systems, vol. 1, Aug. 2002, pp. 547-550; 4 pages.

Minaei et al., "High Performance CMOS Realization of the Third Generation Current Conveyor (CCIII)," MWSCAS, 2002, 16 pages.

Mohit Kumar, "Low-Voltage Current-Mode Analog Cells," M. Tech. Credit Seminar Report, Electronic Systems Group, Nov. 2002, 16 pages.

Montree Siripruchyanun, "Second Generation Current Conveyor (CCII)," PowerPoint Presentation, Jan. 2008; 29 pages.

Pawarangkoon et al., "Four-Quadrant Current-Mode Divider Based on Current Conveyors," IEEE Region 10 Conference TENCON, Nov. 2004, vol. 4, pp. 380-383; 4 pages.

Premont et al., "Current-Conveyor Based Field Programmable Analog Array," Analog Integrated Circuits and Signal Processing, Sep. 1998, vol. 17, pp. 155-157; 3 pages.

U.S. Appl. No. 61/117,031: "Rx Demodulator for CapSense Using a Quasi Differential Channel," Paul Walsh, filed on Nov. 21, 2008; 42 pages.

U.S. Appl. No. 61/163,531: "Multifunctional Capacitance Sensing Front-end Circuit with Current Conveyor," Viktor Kremin, filed on Mar. 26, 2009; 18 pages.

U.S. Appl. No. 61/376,460: "Mutual Capacitance Sensing Using First Order Relaxation Oscillators," Victor Kremin, filed on Aug. 24, 2010; 17 pages.

U.S. Provisional Appl. No. 61/472,161: "Signal Receipt for a TXRX Capacitance Sensing Panel," Hans Klein, filed on Apr. 5, 2011; 12 pages.

Rajpiit et al., "Low Voltage, Low Power, High Performance Current Conveyors," The 2001 IEEE International Symposium on Circuits and Systems, May 2001, vol. 1, pp. 723-726; 4 pages.

Rajput et al., "Advanced Applications of Current Conveyors: A Tutorial," J. of Active and Passive Electronic Devices, vol. 2, 2007, Old City Publishing Inc., pp. 143-164; 22 pages.

USPTO Non Final Rejection for U.S. Appl. No. 13/739,991 dated Apr. 26, 2013; 11 Pages.

* cited by examiner

RECEIVE DEMODULATOR FOR CAPACITIVE SENSING

RELATED APPLICATIONS

This application claims the benefit of U.S. Provisional Application No. 61/117,031 filed on Nov. 21, 2008.

TECHNICAL FIELD

This disclosure relates generally to the field of user interface devices and, in particular, to touch sensor devices.

BACKGROUND

One type of touch sensor device operates by way of capacitance sensing utilizing capacitance sensors. The capacitance detected by a capacitance sensor changes as a function of the proximity of a conductive object to the sensor. The conductive object can be, for example, a stylus or a user's finger. In a touch sensor device, a change in capacitance detected by each sensor in the X and Y dimensions of the sensor array due to the proximity or movement of a conductive object can be measured by a variety of methods. Regardless of the method, usually an electrical signal representative of the capacitance detected by each capacitive sensor is processed by a processing device, which in turn produces electrical or optical signals representative of the position of the conductive object in relation to the touch sensor pad or touch sensor screen in the X and Y dimensions. A touch sensor strip, slider, or button operates on the same capacitance-sensing principle.

One type of touch sensor device operates on a principle known as self capacitance. Self capacitance refers to the capacitance between one electrode of a touch sensor device and ground. A number of self capacitance sensor devices may be arranged in a matrix to form a touch-sensor pad. As the size of the matrix increases, the number of self capacitance sensors increases along with the number of measurements for determining the presence of a conductive object. The increased number of measurements takes a longer amount of time to perform. The speed of the measurements can be increased by sampling the sensors in parallel, however, not all self capacitance sensors can support parallel sensing.

BRIEF DESCRIPTION OF THE DRAWINGS

The present disclosure is illustrated by way of example, and not by way of limitation, in the figures of the accompanying drawings.

DETAILED DESCRIPTION

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Embodiments of a method and apparatus for detecting an input to a capacitive sensor are described. In one embodiment, the sensor elements of a TX-RX capacitive sensor include at least one transmit (TX) electrode and at least one receive (RX) electrode. Each of the sensor elements, including the transmit and receive electrodes, has a parasitic capacitance $C_p$ and a mutual capacitance $C_M$. The parasitic capacitance of a sensor element is the capacitance between the sensor element and ground. The mutual capacitance of the sensor element is the capacitance between the sensor element and other sensor elements.

In one embodiment, a capacitance sensing circuit detects an input at the capacitive sensor by detecting a change in the capacitance of a sensor element. For example, a finger placed near a sensor element may cause a change in the capacitance of the sensor element. The magnitude of this change in capacitance can be detected and converted to a voltage level or a digital code that can be processed by a computer or other suitable circuit or device.

In one embodiment, for a mutual capacitive sensor having transmit and receive electrodes, a signal applied to a transmit electrode induces a current at a receive electrode due to capacitive coupling between the transmit and receive electrodes. The magnitude of the current induced at the receive electrode depends on the degree of capacitive coupling between the electrodes. The proximity of an object, such as a finger, near the electrodes may change the capacitance between the electrodes, as well as the capacitance between the electrodes and ground. This change in turn affects the amount of current induced at the receive electrode. Thus, the magnitude of the induced current reflects the change in capacitance of the transmit and receive electrodes due to the input. A charge based on the induced current is stored in a charge storage circuit, which may include a quasi-differential channel with two integration capacitors.

Figure 1:
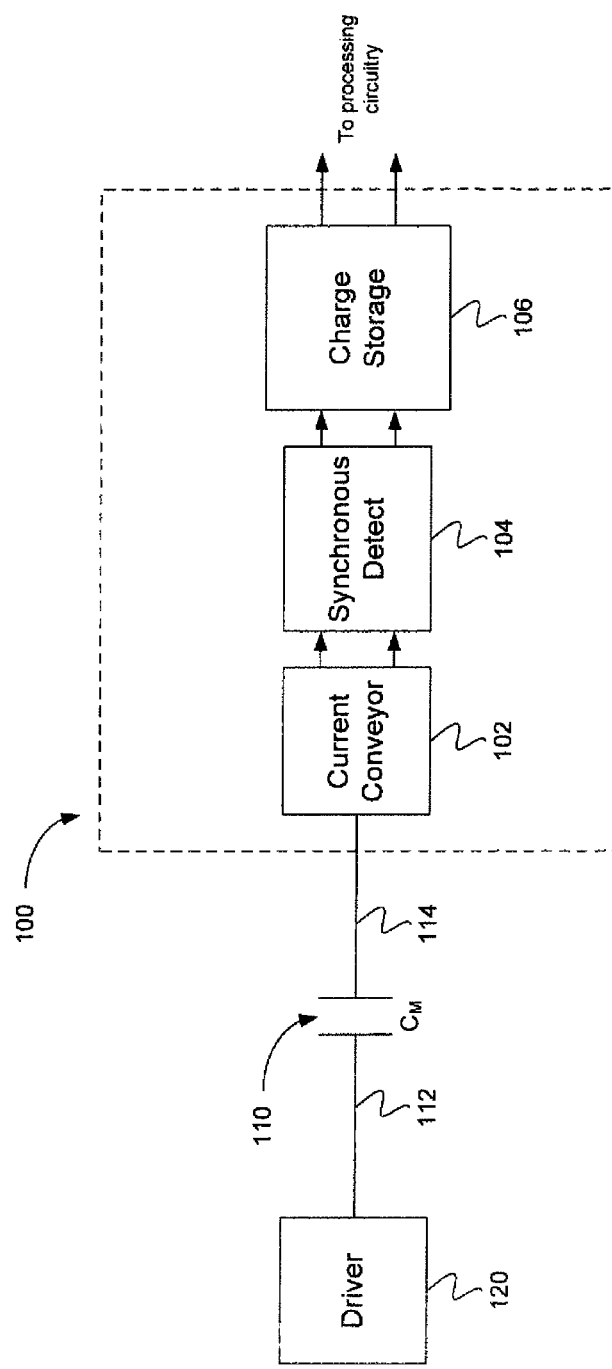
FIG. 1 is a block diagram illustrating a circuit for storing charge from a mutual capacitance sensor according to an embodiment.

FIG. 1 is a block diagram illustrating a demodulation circuit for storing charge from a mutual capacitance sensor according to an embodiment. The demodulation circuit 100 receives a charge sensed by a mutual capacitance sensor device 110. The mutual capacitance sensor 110 may be part of a touch sensor array including a matrix of N×M electrodes (N receive electrodes and M transmit electrodes, where N and M can be any suitable equivalent or different numbers). The transmit and receive electrodes in the electrode matrix may be arranged so that each of the transmit electrodes intersects each of the receive electrodes. Thus, each transmit electrode is capacitively coupled with each of the receive electrodes. A transmit signal applied to each transmit electrode by a transmit driver 120 induces a current at each of the receive electrodes because of the capacitive coupling ($C_M$) between the transmit and receive electrodes. For instance, when the transmit signal is applied to transmit electrodes, the transmit signal induces a receive signal on the receive electrodes in the matrix. The receive signal on each of the receive electrodes can then be measured in sequence by using a multiplexor to connect each of the N receive electrodes to a demodulation circuit including a quasi-differential channel. For ease of explanation, the interaction between one transmit (TX) electrode 112 and one receive (RX) electrode 114 will be discussed. However, it is understood that the capacitance associated with each intersection in the matrix between a transmit electrode and a receive electrode can be sensed by selecting every available combination of a transmit electrode and a receive electrode, for example using multiplexors.

When a conductive object, such as a finger, approaches the intersection between the transmit electrode 112 and the receive electrode 114, the conductive object causes a decrease in capacitance $C_M$ between the electrodes. The transmit electrode 112 may be either a row or a column in the sensor matrix with the receive electrode 114 being the other of a row and a column. In one embodiment, the sensor matrix can be part of an Indium Tin Oxide (ITO) touch sensor device, although other suitable types of touch sensor devices can be used. The induced current waveform at the receive electrode 114 is modified by the change in capacitance and that change is rectified by the demodulation circuit 100. In one embodiment, the demodulation circuit includes current conveyor 102, synchronous detect block 104 and charge storage circuit 106.

Figure 2:
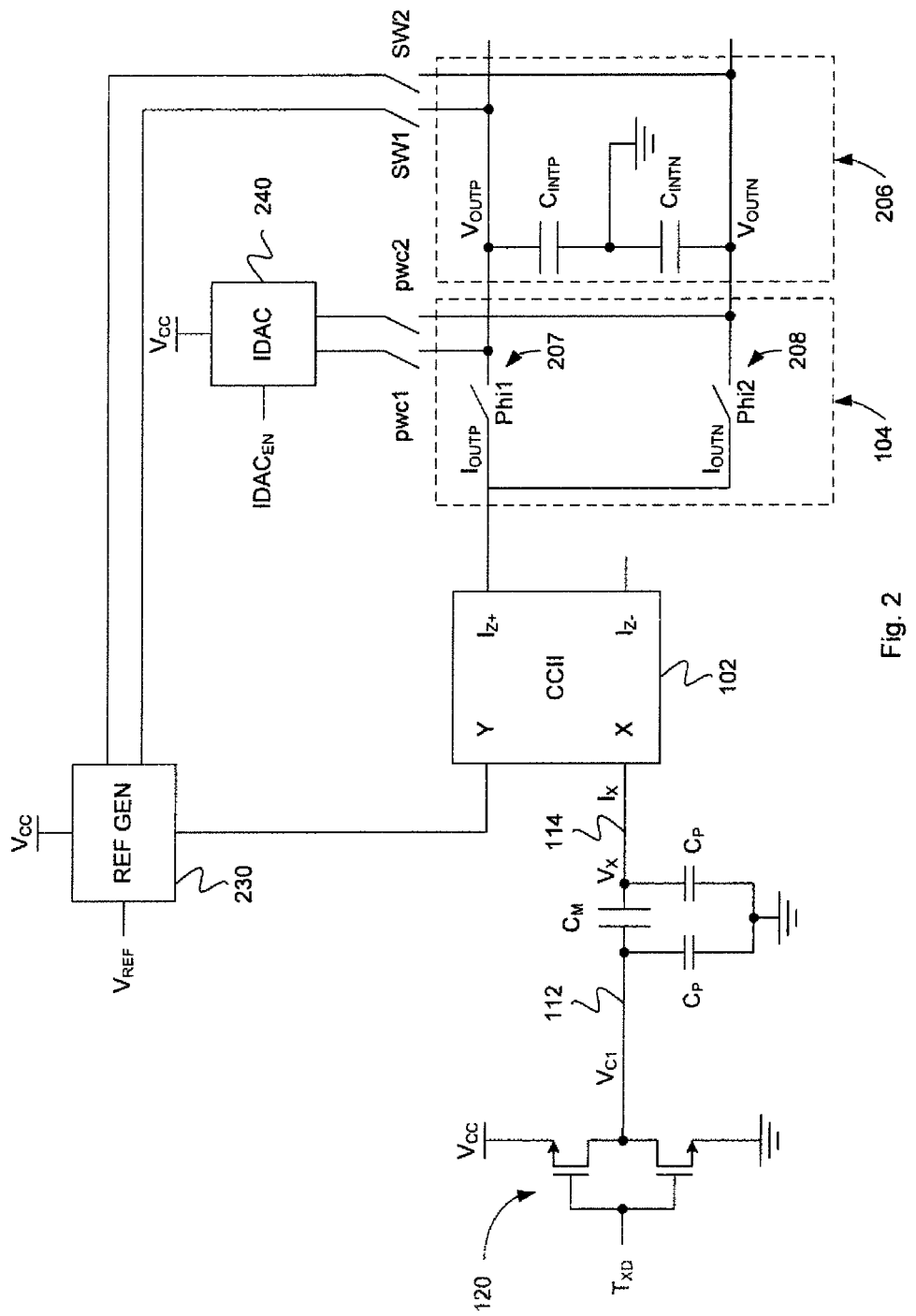
FIG. 2 is a block diagram illustrating a demodulation circuit for storing charge from a mutual capacitance sensor using a quasi-differential channel according to an embodiment.

FIG. 2 is a block diagram illustrating a demodulation circuit for storing charge from a mutual capacitance sensor using a quasi-differential channel according to an embodiment. The mutual capacitance $C_M$ represents the capacitance between a transmit electrode 112 and a receive electrode 114 of a touch sensor device. In one embodiment, a transmit driver circuit 120 drives a transmit voltage $V_{C1}$ onto the transmit electrode 112. The transmit driver circuit 120 may be formed, for example, by two transistors coupled between a supply voltage $V_{CC}$ and ground. The transmit driver is controlled by a control signal $T_{XD}$ which may be supplied by a synchronous control logic circuit (not shown). The control signal $T_{XD}$ alternately causes the transmit driver circuit 120 to supply a high supply voltage of $V_{CC}$ as $V_{C1}$ and then on a subsequent clock cycle, a low supply voltage, such as for example a ground voltage, as $V_{C1}$. In one embodiment, $V_{CC}$ has a potential of 5 V, however, in alternative embodiments $V_{CC}$ has some other suitable potential. In other embodiments, some other appropriate low voltage potential may be used in place of ground, such as a negative supply voltage.

The receive electrode 114 of the mutual capacitance sensor is coupled to a low impedance input (X) of a current conveyor 102. In one embodiment, the current conveyor 102 comprises a current conveyor type two (CCII) or other appropriate type of circuit or device, such as, for example, a suitable configuration of operation amplifiers. The current conveyor 102 receives a voltage supply signal at a high impedance input (Y). In one embodiment, the voltage supply signal is received from reference voltage generator 230. Reference voltage generator 230 may be controlled by a control signal $V_{REF}$. The current conveyor 102 mirrors the voltage supply received at the input Y to the input X. The current conveyor 102 holds the voltage level at the input X at a constant voltage level ($V_X$), regardless of the current ($I_X$) induced at that terminal. In one embodiment, the voltage level $V_X$ may be $V_{CC}/2$ (e.g., 2.5 V). Maintaining the receive electrode 114 at a constant voltage $V_X$ prevents the current $I_X$ from being influenced by the parasitic capacitance $C_p$ between the electrodes 112, 114 and ground.

As the transmit driver circuit 120 pulls the voltage $V_{C1}$ on the transmit electrode 112 to $V_{CC}$, the current $I_X$ flows from $V_{C1}$ through the mutual capacitance $C_M$ to $V_X$ and into the input X of the current conveyor 102. Conversely, when the voltage $V_{C1}$ is pulled to ground, the current $I_X$ is reversed, flowing from a source in the input X of the current conveyor 102. The current conveyor 102 senses the current $I_X$ and mirrors the current at a bipolar output $I_{Z+}$. In one embodiment, when the current $I_X$ is sourced at input X, an output current is also sourced at output $I_{Z+}$. Likewise, when the current $I_X$ is sinked in input X, the output current is sinked at output $I_{Z+}$. Output $I_{Z-}$ of current conveyor 102 inverts the current at $I_{Z+}$, and may be used in some embodiments.

The output current from $I_{Z+}$, passes through a synchronous detect block 104. In one embodiment, the synchronous detect block 104 includes switches 207 and 208. Switches 207 and 208 may be controlled by control signals Phi1 and Phi2, generated by the synchronous control logic circuit (not shown). The output of the synchronous detect block 104 is coupled to the quasi-differential capacitance block 206. In one embodiment, the quasi-differential capacitance block 206 includes positive integration capacitor $C_{INTP}$ and negative integration capacitor $C_{INTN}$. In one embodiment, when the output current at $I_{Z+}$ is positive, switch 207 is activated while switch 208 is opened, allowing the current $T_{OUTP}$ to flow to the output node $V_{OUTP}$. The current $I_{OUTP}$ charges up the positive integration capacitor $C_{INTP}$. When the output current at $I_{Z+}$ is negative, switch 208 is activated while switch 207 is opened, allowing the current $I_{OUTN}$ to flow to the output node $V_{OUTN}$. In one embodiment, the current $I_{OUTN}$ discharges the negative integration capacitor $C_{INTN}$. Alternatively, in another embodiment, the current $I_{OUTN}$ charges $C_{INTN}$ with a negative voltage. For example, if one node of $C_{INTN}$ is held at, for example, 4V, $I_{OUTN}$ can charge $C_{INTN}$ to, for example, 1V with a negative charge. As the current is alternately switched between the integration capacitors, the voltages at output nodes $V_{OUTP}$ and $V_{OUTN}$ grow apart differentially. The differential voltage between output nodes $V_{OUTP}$ and $V_{OUTN}$ can be applied to suitable processing circuitry (not shown) to detect the presence of a conductive object at the mutual capacitive sensor $C_M$.

Figure 3:
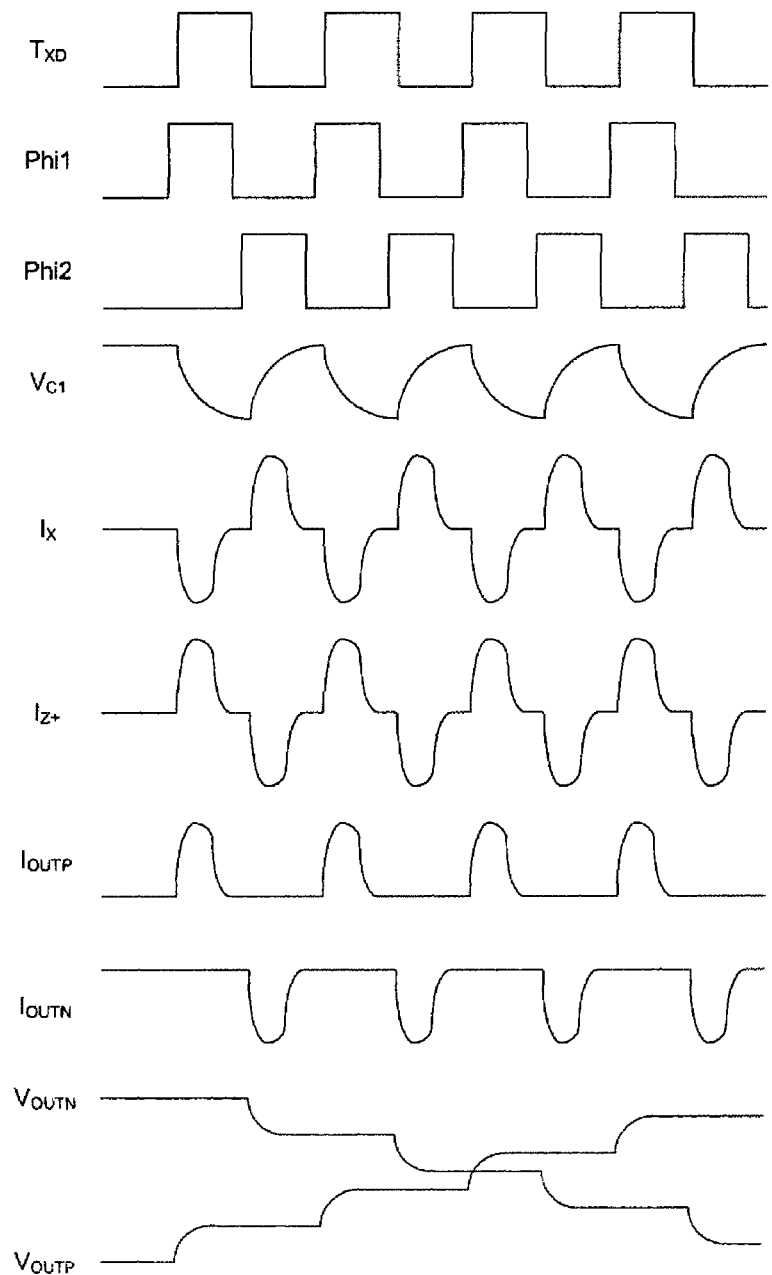
FIG. 3 is a waveform diagram illustrating the waveforms in a demodulation circuit using a quasi-differential channel according to an embodiment.

FIG. 3 is a waveform diagram illustrating the waveforms in a demodulation circuit using a quasi-differential channel according to an embodiment. The waveform $T_{XD}$ represents the control signal applied to a control terminal of transmit driver 120. In one embodiment, $T_{XD}$ is a digital clock signal supplied by a synchronous control logic block. In one embodiment, the transmit driver 120 functions as an inverter, such that when the signal $T_{XD}$ is high, the transmit driver 120 pulls the voltage at $V_{C1}$ low. The waveform $V_{C1}$ represents the voltage level at the transmit electrode 112, coupled to the output of transmit driver 120. As can be seen from the waveforms, when the signal $T_{XD}$ is high, the voltage $V_{C1}$ is pulled low, and when the signal $T_{XD}$ is low, the voltage $V_{C1}$ is pulled high.

The waveform $I_X$ represents the current flowing across the mutual capacitance $C_M$ and into the input X of current conveyor 102. As discussed above, the voltage at the receive electrode 114 is kept constant at some fraction of the supply voltage (e.g., $V_{CC}/2$). Thus, when the voltage $V_{C1}$ on transmit electrode 112 is pulled high to $V_{CC}$, the resulting voltage differential induces a current $I_X$ across $C_M$ and into the input X of current conveyor 102. In one embodiment, this current sinked in the current conveyor 102 is referred to as a positive current, as is indicated in the waveform $I_X$. When the voltage $V_{C1}$ on transmit electrode 112 is pulled low (e.g., to a ground potential), the voltage differential induces a current $I_X$ across $C_M$ out of the input X of current conveyor 102. In one embodiment, this current sourced in the current conveyor 102 is referred to as a negative current, as is indicated in the waveform $I_X$.

The current conveyor 102 mirrors the current $I_X$ at the bipolar output $I_{Z+}$. The waveform $I_{Z+}$ represents the current at the bipolar output. When the current $I_X$ is sourced at input X, an output current is also sourced at output $I_{Z+}$. In one embodiment, this current is referred to as a positive current Likewise, when the current $I_X$ is sinked in input X, the output current is sinked at output $I_{Z+}$. In one embodiment, this current is referred to as a negative current.

The waveforms Phi1 and Phi2 represent the control signals for switches 207 and 208, respectively. In one embodiment, Phi1 and Phi2 are generated by the synchronous control logic block. The synchronous control logic block causes the signal Phi1 to be high when the signal $T_{XD}$ is high, because the resulting current at $I_{Z+}$ will be positive. The high signal Phi1 causes switch 207 to close allowing a current $I_{OUTP}$ to flow to output node $V_{OUTP}$. The current $I_{OUTP}$ charges up the integration capacitor $C_{INTP}$, causing the output voltage to increase, as shown in the waveform $V_{OUTP}$. The synchronous control logic block further causes the signal Phi2 to be high when the signal $T_{XD}$ is low, because the resulting current at $I_{Z+}$ will be negative. The high signal Phi2 causes switch 208 to close allowing a current $I_{OUTN}$ to flow to output node $V_{OUTN}$. The current $I_{OUTN}$ discharges the integration capacitor $C_{INTN}$, causing the output voltage to decrease, as shown in the waveform $V_{OUTN}$. In one embodiment, the waveforms Phi1 and Phi2 are non-overlapping and the waveform $T_{XD}$ is delayed with respect to Phi1 and Phi2, such that Phi1 and Phi2 have changed state before $T_{XD}$ changes.

Referring again to FIG. 2, the demodulator circuit may include a baseline compensation circuit 240. The baseline capacitance of a sensor element may be described as the capacitance of the sensor element when no input (i.e., a finger touch) is present. The ability to detect the presence of a conductive object may be degraded if the baseline capacitance, resulting from $C_p$ and $C_M$, is large in comparison to the measured capacitance. Small variations of $C_M$ may be difficult to detect when measured in the presence of the large base value of $C_M$. Thus, in one embodiment, the effects of base value of $C_M$ are compensated with baseline compensation circuit 240. In one embodiment, the baseline compensation circuit 240 may include a current output or switched current digital-to-analog converter (IDAC). The IDAC is configured, via control signal $IDAC_{EN}$, to subtract a portion of the positive and negative output currents $I_{OUTP}$ and $I_{OUTN}$ during each clock cycle. The amount that is subtracted from the output currents may be programmable via $IDAC_{EN}$. Switches pwc1 and pwC2 control which output current is subtracted. Switches pwc1 and pwC2 may be controlled by a signal from the synchronous logic control circuit. In one example, where the mutual capacitance $C_M$ has a baseline charge value of 1 picocoulomb (pC), the presence of a conductive object near the sensor may only cause a small increase in charge (e.g., 10% or 0.1 pC). Thus, the charge output by the current conveyor 102 would be 1.1 pC. In the example, the baseline IDAC subtracts 90% of the baseline charge (i.e., 0.9 pC) from each of currents $I_{OUTP}$ and $I_{OUTN}$, resulting in a baseline of 0.1 pC and a measured value of 0.2 pC. This 100% increase is significantly easier to detect than the 10% increase attributable to the conductive object. In other embodiments, some other suitable percentage may be used for baseline compensation. The baseline compensation scheme is designed to remove as much DC content from the input current as possible to better detect a change in $C_M$ and to increase the signal-to-noise ratio.

In one embodiment, the integration capacitors $C_{INTP}$ and $C_{INTN}$ are pre-charged to a certain voltage level. Depending on the technology used to implement the circuit, a certain amount of headroom may be used. In one embodiment, where the supply voltage is, for example, 5V, the positive integration capacitor $C_{INTP}$ may be pre-charged to, for example, 1V and the negative integration capacitor $C_{INTN}$ may be pre-charged to, for example, 4V, allowing 1V of headroom on either end of the supply range. In one embodiment, the pre-charging is accomplished using voltages from reference generator 230 where the application of the voltage levels is controlled by switches SW1 and SW2.

Figure 4:
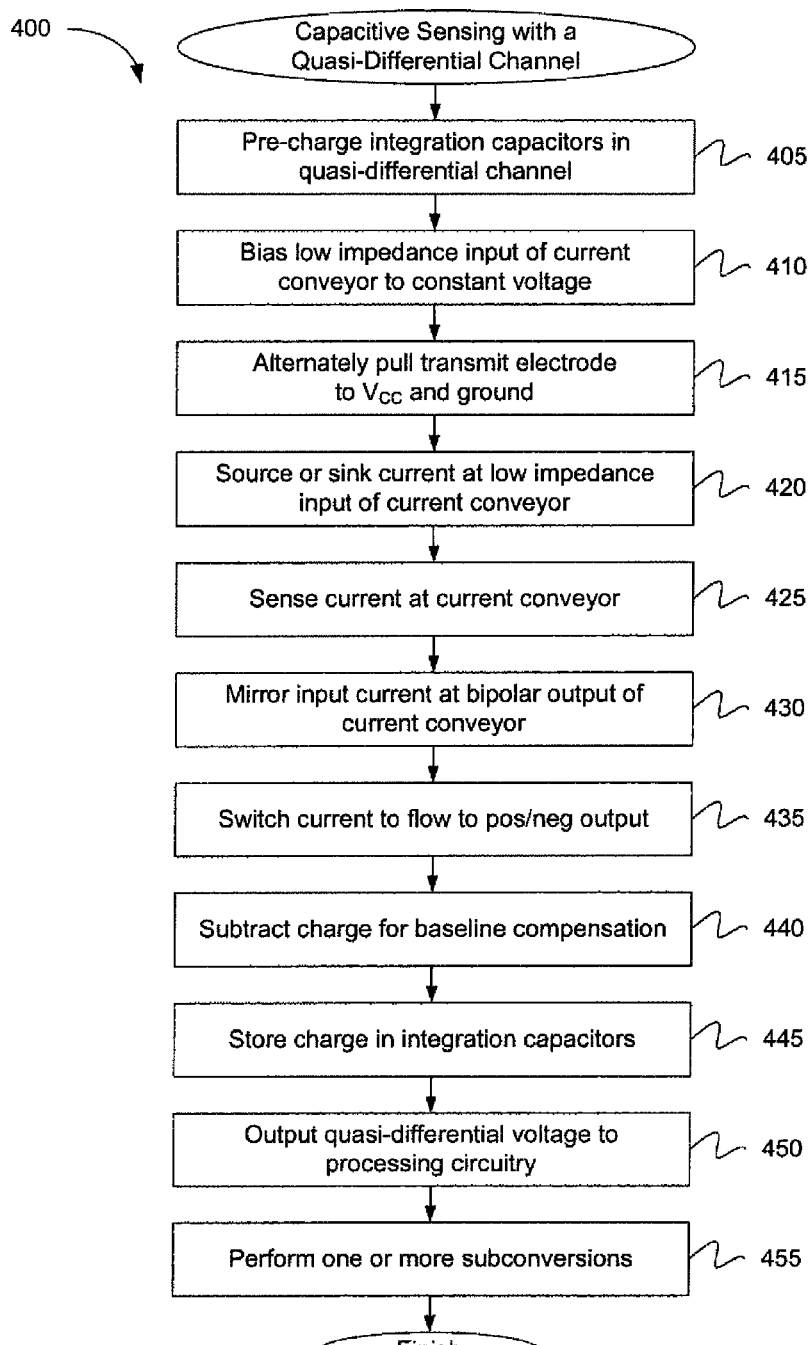
FIG. 4 is a flowchart illustrating a method of storing charge from a mutual capacitance sensor using a quasi-differential channel according to an embodiment.

FIG. 4 is a flowchart illustrating a method 400 of storing charge from a mutual capacitance sensor using a quasi-differential channel according to an embodiment. At block 405, method 400 pre-charges the integration capacitors of the quasi-differential channel. At block 410, method 400 sets the low impedance input of a current conveyor, such as current conveyor 102, to a constant voltage. At block 415, method 400 alternately pulls the transmit electrode of the mutual capacitance sensor to the supply voltage $V_{CC}$ and ground (e.g., 0V). The voltage may be applied to the transmit electrode using, for example, the transmit driver circuit 120 of FIG. 2. At block 420, method 400 induces a current across the mutual capacitance sensor that is alternately sourced and sinked in the low impedance input of the current conveyor.

At block 425, method 400 senses the current at the low impedance input of the current conveyor. The current may be affected by the presence of a conductive object near the mutual capacitance sensor. At block 430, method 400 mirrors the sensed input current at a bipolar output of the current conveyor. At block 435, method 400 switches the current to flow to either the positive or negative output node. When the current at the bipolar output of the current conveyor is positive, switch 207 is activated, and when the current is negative, switch 208 is activated.

At block 440, a programmable amount of charge is subtracted from each of the positive and negative currents to compensate for the baseline capacitance of the mutual capacitance sensor. At block 445, the remaining charge is stored in the integration capacitors. The charge from the positive output current is stored in the positive integration capacitor, causing the positive output voltage to increase. The negative output current discharges the negative integration capacitor, causing the negative output voltage to decrease. At block 450, the quasi-differential voltage between the positive output node and the negative output node is output to processing circuitry for determination of whether a conductive object is present.

In one embodiment, the processing circuitry (described below with respect to FIG. 6) determines the presence of a conductive object based on the difference between two mean values. Noise and other interference in the system may cause variations in the output voltages over time. Thus, in one embodiment, a series of values are stored and a mean value is calculated for the baseline capacitance (i.e., when no conductive object is present) and for the sensed capacitance (i.e., when a conductive object is present). As the number of samples in the series of values increases, the mean values become more accurate. In one embodiment, 100 samples may be used to calculate the mean values, although any suitable number of samples may be used. A sample may correspond to one period of the $T_{XD}$ clock signal and may include the storing of charge on each of the positive and negative integration capacitors. In order to store 100 samples on the integration capacitors, the capacitors would have to be very large. Therefore, at block 455, method 400 can perform one or more subconversions. A subconversion includes storing the charge for a smaller number of clock cycles (e.g., 10 cycles, 20 cycles, or any appropriate smaller number of clock cycles) and outputting the voltage levels to the processing circuitry. In one example where a subconversion includes 10 cycles, 10 subconversions would be performed to achieve the 100 samples needed to calculate the mean values. In other embodiments, a subconversion may include some other suitable number of samples, and some other suitable number of samples may be used to calculate the mean values.

Figure 5:
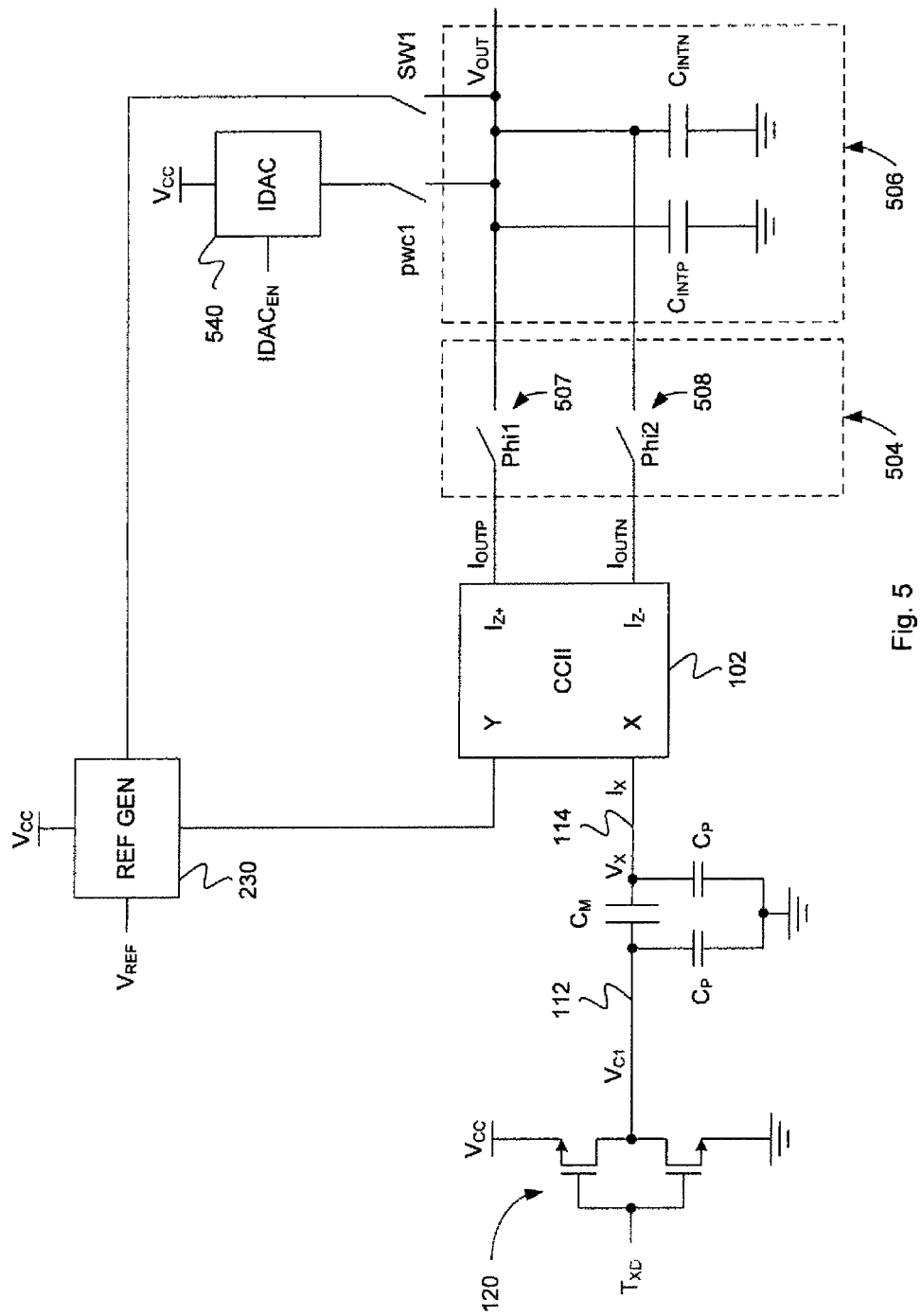
FIG. 5 is a block diagram illustrating a circuit for storing charge from a mutual capacitance sensor according to an embodiment.

FIG. 5 is a block diagram illustrating a circuit for storing charge from a mutual capacitance sensor according to an embodiment. In this embodiment, the output current from both $I_{Z+}$ and $I_{Z-}$ (i.e., $I_{OUTP}$ and $I_{OUTN}$) are passed through synchronous detect block 504. In one embodiment, the synchronous detect block 504 includes switches 507 and 508. Switches 507 and 508 may be controlled by control signals Phi1 and Phi2, generated by the synchronous control logic circuit (not shown). The output of the synchronous detect block 504 is coupled to the charge storage circuit 506. In one embodiment, the charge storage circuit 506 includes positive integration capacitor $C_{INTP}$ and negative integration capacitor $C_{INTN}$. In one embodiment, when the output current at $I_{Z+}$ is positive, switch 507 is activated while switch 508 is opened, allowing the current $I_{OUTP}$ to flow to the output node $V_{OUT}$. The current $I_{OUTP}$ charges up the positive integration capacitor $C_{INTP}$. When the output current at $I_{Z-}$ is negative, switch 508 is activated while switch 507 is opened, allowing the current $I_{OUTN}$ to flow to the output node $V_{OUT}$. In one embodiment, the current $I_{OUTN}$ discharges the negative integration capacitor $C_{INTN}$. Alternatively, in another embodiment, the current $I_{OUTN}$ charges $C_{INTN}$ with a negative voltage. The voltage at output node $V_{OUT}$ can be applied to suitable processing circuitry (not shown) to detect the presence of a conductive object at the mutual capacitive sensor $C_M$.

In one embodiment, IDAC 540 is a single ended IDAC configured, via control signal $IDAC_{EN}$, to perform baseline compensation by subtracting a portion of the output current during each clock cycle. The amount that is subtracted from the output current may be programmable via $IDAC_{EN}$. Switch pwc1 controls when output current is subtracted.

Figure 6:
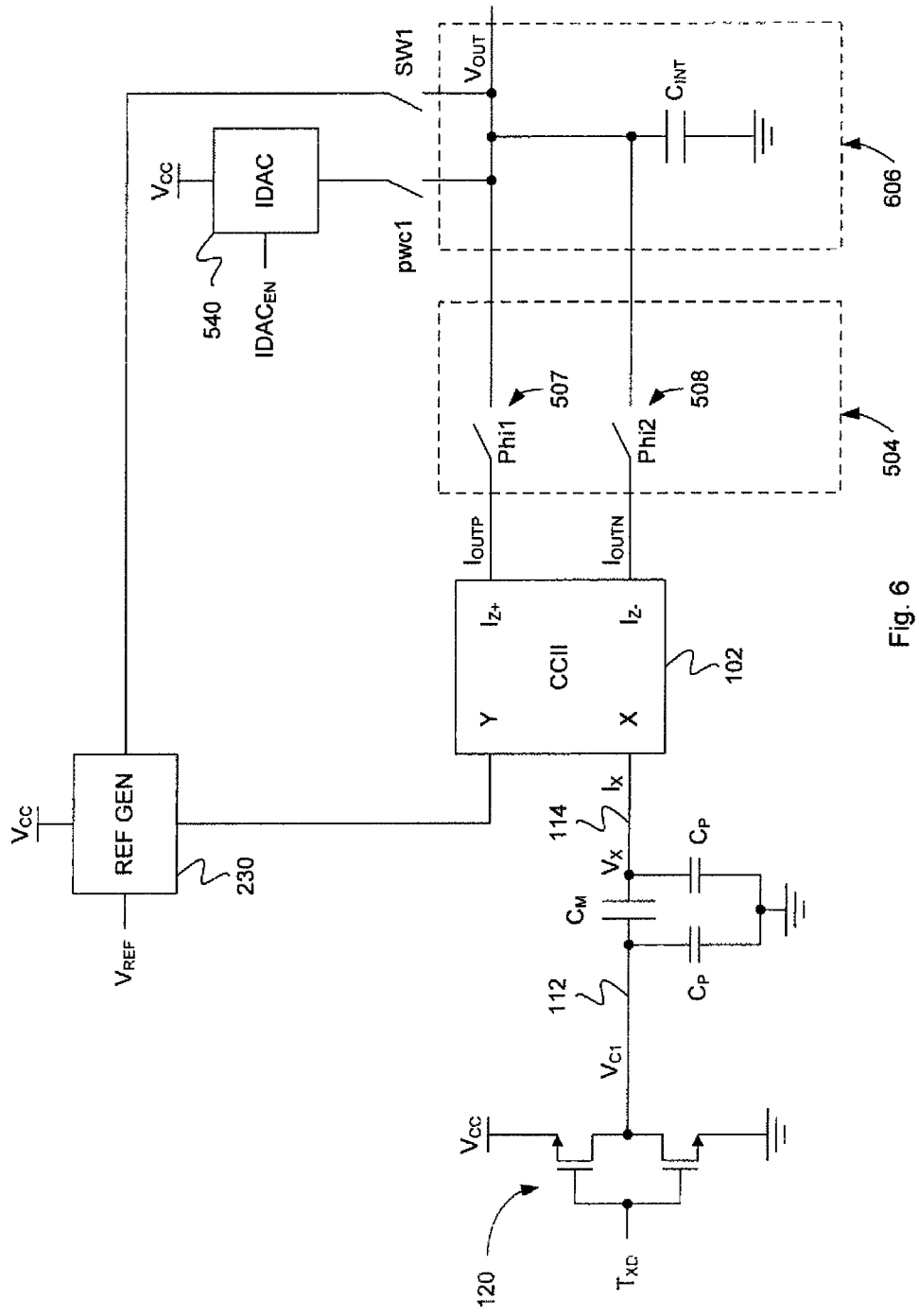
FIG. 6 is a block diagram illustrating a circuit for storing charge from a mutual capacitance sensor using a single capacitor to ground according to an embodiment.

FIG. 6 is a block diagram illustrating a circuit for storing charge from a mutual capacitance sensor using a single capacitor to ground according to an embodiment. Output $I_{Z-}$ of current conveyor 102 inverts the current at $I_{Z+}$, and may be used in an embodiment where there is a single integration capacitor coupled to ground. In this embodiment, the currents from outputs $I_{Z+}$ and $I_{Z-}$ are alternately applied to the integration capacitor $C_{INT}$ through a switching circuit 504. The change in charge stored on the integration capacitor can be used to detect the presence of a conductive object, when the output voltage $V_{OUT}$ is applied to suitable processing circuitry.

Figure 7:
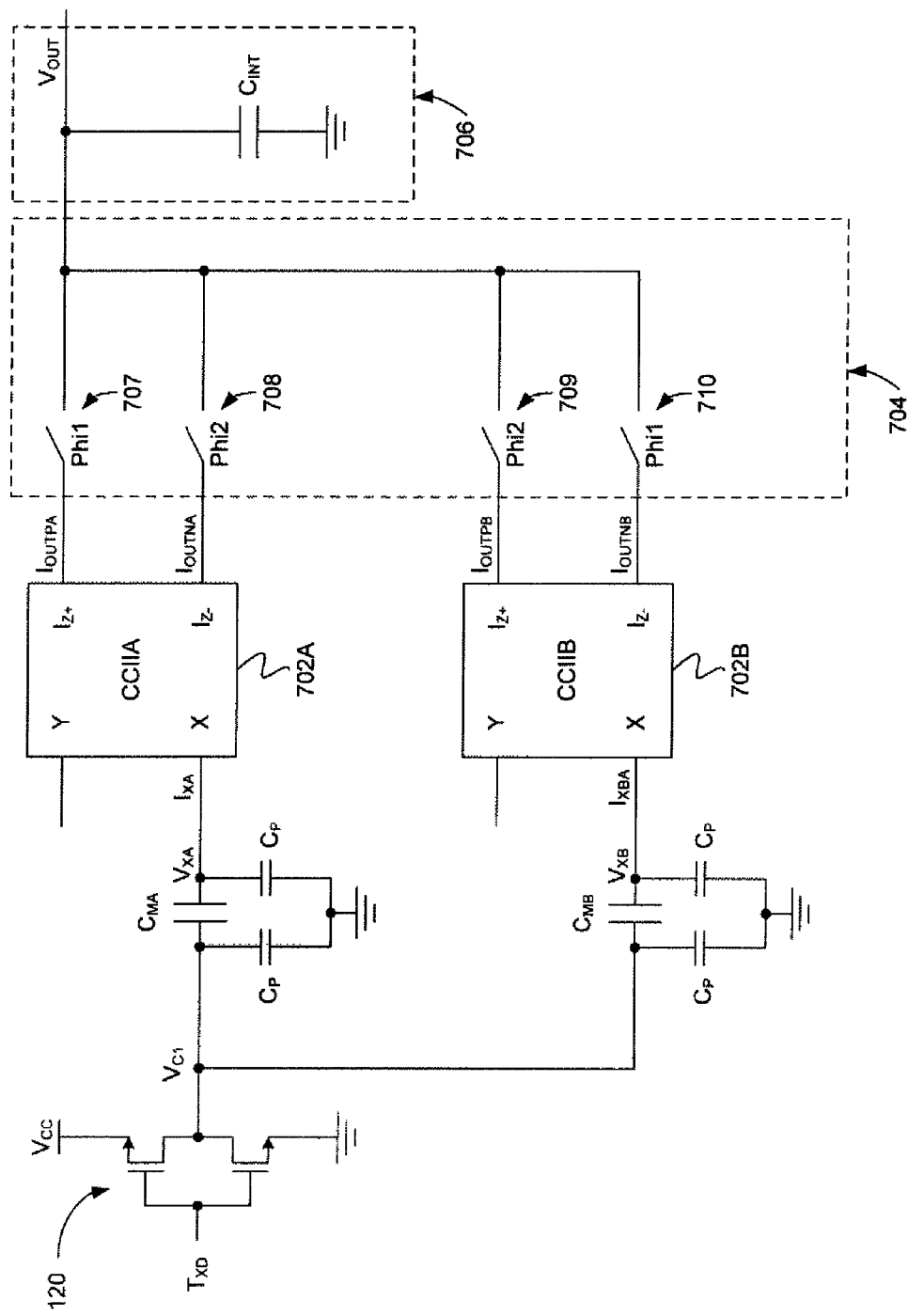
FIG. 7 is a block diagram illustrating a circuit for storing charge from a mutual capacitance sensor in a differential mode according to an embodiment.

FIG. 7 is a block diagram illustrating a circuit for storing charge from a mutual capacitance sensor in a differential mode according to an embodiment. In one embodiment, there are two or more mutual capacitance sensors, $C_{MA}$ and $C_{MB}$, each representing the capacitance between a transmit electrode and a receive electrode of a touch sensor device. In one embodiment, the transmit driver circuit 120 drives a transmit voltage $V_{C1}$ onto the transmit electrode of both mutual capacitance sensors. The receive electrode for each mutual capacitance sensor is coupled to a current conveyor 702A and 702B. Each current conveyor senses the current across the mutual capacitance sensor, $I_{XA}$ and $I_{XB}$, and mirrors the current at a bipolar output $I_{Z+}$.

In one embodiment, the output current from both $I_{Z+}$, and $I_{Z-}$ of each current conveyor 702A and 702B (i.e., $I_{OUTP}$ and $I_{OUTN}$) is passed through synchronous detect block 704. In one embodiment, the synchronous detect block 704 includes switches 707, 708, 709 and 710. Switches 707-710 may be controlled by one of control signals Phi1 and Phi2, generated by the synchronous control logic circuit (not shown). In one embodiment, switches 707 and 710 are controlled by Phi1 and switches 708 and 709 are controlled by Phi2. The output of the synchronous detect block 704 is coupled to the charge storage circuit 706. In one embodiment, the charge storage circuit 706 includes a single integration capacitor $C_{INT}$ coupled to ground or some other suitable low supply voltage. In one embodiment, when the control signal Phi1 is activated, positive charge flows onto $C_{INT}$ from $I_{Z+}$ of current conveyor 702A and negative charge flows onto $C_{INT}$ from $I_{Z-}$ of current conveyor 702B. Since the output current from current conveyor 702A is affected by the mutual capacitance sensor $C_{MA}$, the presence of a conductive object proximate to $C_{MA}$ will cause the voltage at $V_{OUT}$ to decrease. Conversely, the presence of a conductive object proximate to mutual capacitance sensor $C_{MB}$ will cause the voltage at $V_{OUT}$ to increase.

When the control signal Phi2 is activated, negative charge flows onto $C_{INT}$ from $I_{Z-}$ of current conveyor 702A and positive charge flows onto $C_{INT}$ from $I_{Z+}$ of current conveyor 702B. Accordingly, the presence of a conductive object proximate to $C_{MA}$ will cause the voltage at $V_{OUT}$ to increase, while the presence of a conductive object proximate to mutual capacitance sensor $C_{MB}$ will cause the voltage at $V_{OUT}$ to decrease. The voltage at output node $V_{OUT}$ can be applied to suitable processing circuitry (not shown) to detect the presence of a conductive object at the mutual capacitive sensors $C_{MA}$ and $C_{MB}$.

Figure 8:
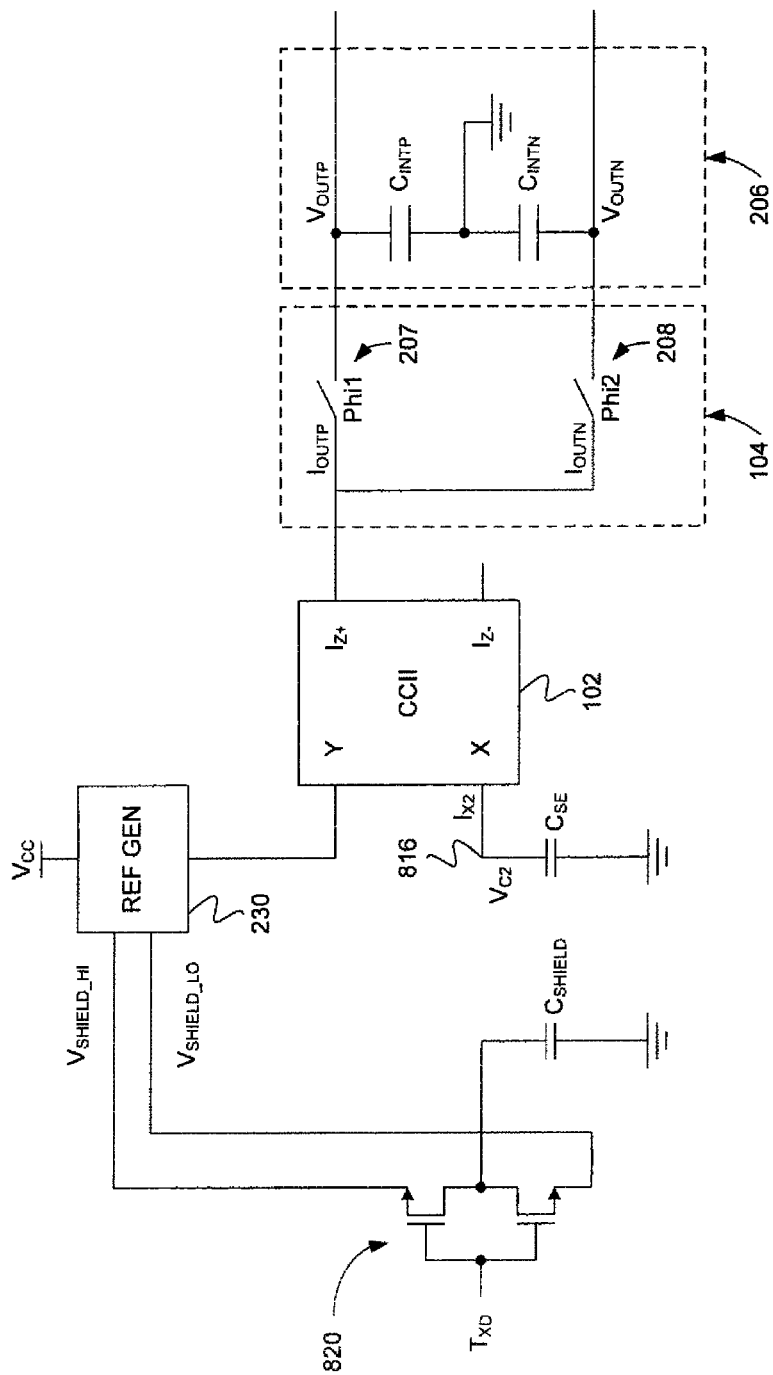
FIG. 8 is a block diagram illustrating a circuit for storing charge from a self capacitance sensor using a quasi-differential channel according to an embodiment.

FIG. 8 is a block diagram illustrating a circuit for storing charge from a self capacitance sensor using a quasi-differential channel according to an embodiment. The self capacitance $C_{SE}$ represents the capacitance between one electrode 816 of a touch sensor device and ground. The electrode 816 of the self capacitance sensor is coupled to a low impedance input (X) of a current conveyor 102. In one embodiment, the current conveyor 102 can comprise a current conveyor type two (CCII) or other suitable type of circuit or device, such as, for example, a suitable configuration of operation amplifiers. The current conveyor 102 receives a voltage supply signal at a high impedance input (Y). In one embodiment the voltage supply signal is received from reference voltage generator 230. The current conveyor 102 mirrors the voltage supply received at the input Y to the input X.

In one embodiment, the voltage $V_{C2}$ at the electrode 816 is controlled by varying the supply voltage at the input Y of current conveyor 102. As the voltage $V_{C2}$ is increased, a current $I_{X2}$ flows out of the input X of current conveyor 102 and through self capacitance $C_{SE}$. As the voltage $V_{C2}$ is decreased, the current $I_{X2}$ flows into the input X of current conveyor 102. The current conveyor 102 senses the current $I_{X2}$ and mirrors the current at a bipolar output $I_{Z+}$. In one embodiment, when the current $I_X$ is sourced at input X, an output current is also sourced at output $I_{Z+}$. Likewise, when the current $I_X$ is sinked in input X, the output current is sinked at output $I_{Z+}$.

The output current from $I_{Z+}$ passes through a synchronous detect block 104. In one embodiment, the synchronous detect block 104 includes switches 207 and 208. Switches 207 and 208 may be controlled by control signals Phi1 and Phi2, generated by the synchronous control logic circuit (not shown). The output of the synchronous detect block 104 is coupled to the quasi-differential capacitance block 206. In one embodiment, the quasi-differential capacitance block 206 includes positive integration capacitor $C_{INTP}$ and negative integration capacitor $C_{INTN}$. In one embodiment, when the output current at $I_{Z+}$ is positive, switch 207 is activated while switch 208 is opened, allowing the current $I_{OUTP}$ to flow to the output node $V_{OUTP}$. The current $I_{OUTP}$ charges up the positive integration capacitor $C_{INTP}$. When the output current at $I_{Z+}$ is negative, switch 208 is activated while switch 207 is opened, allowing the current $I_{OUTN}$ to flow to the output node $V_{OUTN}$. The current $I_{OUTN}$ discharges the negative integration capacitor $C_{INTN}$. As the current is alternately switched between the integration capacitors, the voltages at output nodes $V_{OUTP}$ and $V_{OUTN}$ grow apart differentially. The differential voltage between output nodes $V_{OUTP}$ and $V_{OUTN}$ can be applied to processing circuitry (not shown) to detect the presence of a conductive object at the self capacitive sensor $C_{SE}$.

In one embodiment, the transmit driver circuit 820 drives a transmit voltage onto one terminal of a shield capacitor $C_{SHIELD}$. The transmit driver circuit 820 may include a voltage divider formed, for example, by two transistors coupled between two voltages, $V_{SHIELD\_HI}$ and $V_{SHIELD\_LO}$. $V_{SHIELD\_HI}$ and $V_{SHIELD\_LO}$ may be supplied by reference voltage generator 230. The transmit driver circuit 820 is controlled by a control signal $T_{XD}$ which may be supplied by a synchronous control logic circuit (not shown). The control signal $T_{XD}$ alternately causes the transmit driver circuit 820 to supply a voltage of $V_{SHIELD\_HI}$ to $C_{SHIELD}$, and then on a subsequent clock cycle, $V_{SHIELD\_LO}$. The shield capacitance reduces the effect of parasitic capacitance on the self capacitance sensor $C_{SE}$.

Figure 9:
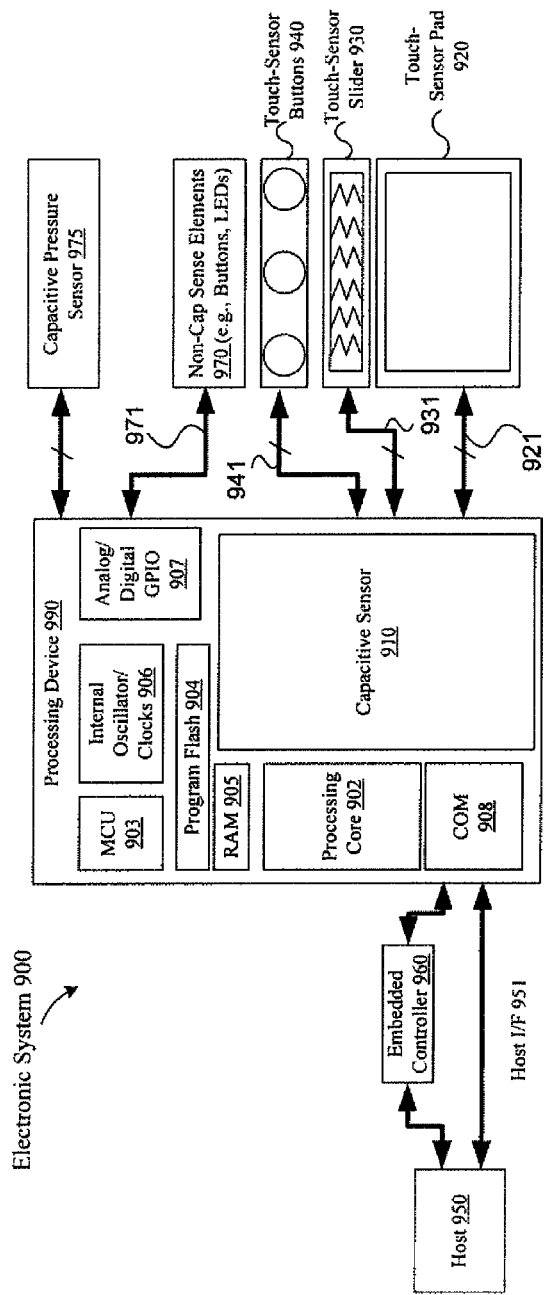
FIG. 9 illustrates a block diagram of one embodiment of an electronic system having a processing device for storing charge from a mutual or self capacitance sensor according to an embodiment.

FIG. 9 illustrates a block diagram of one embodiment of an electronic system 900 having a processing device for storing charge from a mutual or self capacitance sensor using a quasi-differential channel according to an embodiment. In one embodiment, electronic system 900 may include the method and apparatus described hereinbefore and illustrated in FIGS. 1 through 8. For purposes of illustration and not limitation, electronic system 900 can include, for example, processing device 990, touch-sensor pad 920, touch-sensor slider 930, touch-sensor buttons 940, host processor 950, embedded controller 960 and non-capacitive sensor elements 970. The processing device 990 may include analog and/or digital general purpose input/output ("GPIO") ports 907. GPIO ports 907 may be programmable. GPIO ports 907 may be coupled to a Programmable Interconnect and Logic ("PIL"), which acts as an interconnect between GPIO ports 907 and a digital block array of the processing device 990 (not illustrated). The digital block array may be configured to implement a variety of digital logic circuits (e.g., DAC, digital filters, digital control systems, and the like) using, in one embodiment, configurable user modules ("UMs"). The digital block array may be coupled to a system bus. Processing device 990 may also include memory, such as random access memory (RAM) 905 and program flash 904. RAM 905 may be static RAM (SRAM), and program flash 904 may be a non-volatile storage, which may be used to store firmware (e.g., control algorithms executable by processing core 902 to implement operations described herein). Processing device 990 may also include a memory controller unit (MCU) 903 coupled to memory and the processing core 902.

The processing device 990 may also include an analog block array (not illustrated). The analog block array is also coupled to the system bus. Analog block array also may be configured to implement a variety of analog circuits (e.g., ADC, analog filters, etc.) using, in one embodiment, configurable UMs. The analog block array may also be coupled to the GPIO 907.

As illustrated, capacitive sensor 910 may be integrated into processing device 990. Capacitive sensor 910 may include analog I/O for coupling to an external component, such as touch-sensor pad 920, touch-sensor slider 930, touch-sensor buttons 940, and/or other devices.

It should be noted that the embodiments described herein are not limited to touch-sensor pads for notebook implementations, but can be used in any other suitable type of capacitive sensing implementation. For example, the sensing device may be a touch-sensor slider 930, or a touch-sensor button 940 (e.g., capacitance sensing button). Similarly, the operations described herein are not limited to notebook cursor operations, but can include other appropriate types of operations, such as lighting control (dimmer), volume control, graphic equalizer control, speed control or other control operations requiring gradual adjustments. It should also be noted that these embodiments of capacitive sensing implementations may be used in conjunction with non-capacitive sensing elements, including but not limited to pick buttons, sliders (e.g., display brightness and contrast), scroll-wheels, multi-media control (e.g., volume, track advance, and the like), handwriting recognition, and numeric keypad operation.

In one embodiment, the electronic system 900 includes a touch-sensor pad 920 coupled to the processing device 990 via bus 921. Touch-sensor pad 920 may include a multi-dimension sensor array. The multi-dimension sensor array comprises a plurality of sensor elements, organized as rows and columns. In an alternative embodiment, the electronic system 900 includes a touch-sensor slider 930 coupled to the processing device 990 via bus 931. Touch-sensor slider 930 may include a single-dimension sensor array. The single-dimension sensor array comprises a plurality of sensor elements, organized as rows, or, alternatively, as columns. In another embodiment, the electronic system 900 includes a touch-sensor button 940 coupled to the processing device 990 via bus 941. Touch-sensor button 940 may include a single-dimension or multi-dimension sensor array. The single- or multi-dimension sensor array comprises a plurality of sensor elements. For a touch-sensor button, the plurality of sensor elements may be coupled together to detect a presence of a conductive object over the entire surface of the sensing device. Alternatively, the touch-sensor button 940 has a single sensor element to detect the presence of the conductive object. In one embodiment, the touch-sensor button 940 may be a capacitive sensor element. Capacitive sensor elements may be used as non-contact switches. These switches, when protected by an insulating layer, offer resistance to severe environments.

The electronic system 900 may include any combination of one or more of the touch-sensor pad 920, touch-sensor slider 930, touch-sensor button 940 and/or capacitive pressure sensor 975. In an alternative embodiment, the electronic system 900 may also include non-capacitive sensor elements 970 coupled to the processing device 990 via bus 971. The non-capacitive sensor elements 970 may include buttons, light emitting diodes (LEDs), and other user interface devices, such as a mouse, a keyboard or other functional keys that do not require capacitance sensing. In one embodiment, buses 971, 941, 931 and 921 may be a single bus. Alternatively, these buses may be configured into any combination of one or more separate buses.

The processing device may also provide value-added functionality, such as keyboard control integration, LEDs, battery charger and general purpose I/O, as illustrated as non-capacitive sensor elements 970. Non-capacitive sensor elements 970 are coupled to the GPIO 907.

The processing device 990 can include other suitable types of circuits, modules, arrays, and other like analog and digital elements. For example, processing device 990 may include internal oscillator/clocks 906 and communication block 908. The oscillator/clocks block 906 provides clock signals to one or more of the components of processing device 990. Communication block 908 may be used to communicate with an external component, such as a host processor 950, via host interface (I/F) line 951. Alternatively, processing device 990 may also be coupled to embedded controller 960 to communicate with the external components, such as host 950. Interfacing to the host 950 can be through various methods. In one exemplary embodiment, interfacing with the host 950 may be done using a standard PS/2 interface to connect to an embedded controller 960, which in turn sends data to the host 950 via low pin count (LPC) interface. In some instances, it may be beneficial for the processing device 990 to do both touch-sensor pad and keyboard control operations, thereby freeing up the embedded controller 960 for other housekeeping functions. In another exemplary embodiment, interfacing may be done using a universal serial bus (USB) interface directly coupled to the host 950 via host interface line 951. Alternatively, the processing device 990 may communicate to external components, such as the host 950, using industry standard interfaces, such as USB, PS/2, inter-integrated circuit (I2C) bus, system packet interfaces (SPI), or any other suitable type of interface. In one embodiment, the host 950 and/or embedded controller 960 may be coupled to the processing device 990 with a ribbon or flex cable from an assembly, which houses the sensing device and processing device.

In one embodiment, the processing device 990 is configured to communicate with the embedded controller 960 or the host 950 to send and/or receive data. The data may be a command or alternatively a signal. In an exemplary embodiment, the electronic system 900 may operate in both standard-mouse compatible and enhanced modes. The standard-mouse compatible mode utilizes the HID class drivers already built into the Operating System (OS) software of host 950. These drivers enable the processing device 990 and sensing device to operate as a standard cursor control user interface device, such as a two-button PS/2 mouse. The enhanced mode may enable additional features such as scrolling (reporting absolute position) or disabling the sensing device, such as when a mouse is plugged into the notebook. Alternatively, the processing device 990 may be configured to communicate with the embedded controller 960 or the host 950 using non-OS drivers, such as dedicated touch-sensor pad drivers, or other drivers known by those of ordinary skill in the art.

In other words, the processing device 990 may operate to communicate data (e.g., commands or signals) using hardware, software, and/or firmware, and the data may be communicated directly to the processing device of the host 950, such as a host processor, or alternatively, may be communicated to the host 950 via drivers of the host 950, such as OS drivers or other non-OS drivers. It should also be noted that the host 950 may directly communicate with the processing device 990 via host interface 951.

In one embodiment, the data sent to the host 950 from the processing device 990 includes click, double-click, movement of the cursor, scroll-up, scroll-down, scroll-left, scroll-right, step back, step forward, Rewind, Fast Forward, Play, Stop, and the like. Alternatively, other user interface device commands and/or signals may be communicated to the host 950 from the processing device 990. These commands may be based on gestures occurring on the sensing device that are recognized by the processing device, such as tap, push, hop, and zigzag gestures. Alternatively, other commands and/or signals may be recognized. For example, signals may be sent that indicate the recognition of these operations.

In particular, a tap gesture, for example, may be a user's finger (e.g., conductive object) that is on the sensing device for less than a threshold time. If the time the finger is placed on the touchpad is greater than the threshold time, it may be considered to be a movement of the cursor, in the x- or y-axes. Scroll-up, scroll-down, scroll-left, and scroll-right, step back, and step-forward may be detected when the absolute position of the conductive object is within a pre-defined area, and movement of the conductive object is detected.

Processing device 990 may reside on a common carrier substrate such as, for example, an integrated circuit (IC) die substrate, a multi-chip module substrate or the like. Alternatively, the components of processing device 690 may be one or more separate integrated circuits and/or discrete components. In one exemplary embodiment, processing device 990 may be a Programmable System on a Chip (PSoC™) processing device, manufactured by Cypress Semiconductor Corporation, San Jose, Calif. Alternatively, processing device 990 may be one or more other processing devices known by those of ordinary skill in the art, such as a microprocessor or central processing unit, a controller, special-purpose processor, digital signal processor (DSP), an application specific integrated circuit (ASIC), a field programmable gate array (FPGA), or the like. In an alternative embodiment, for example, the processing device 990 may be a network processor having multiple processors including a core unit and multiple microengines. Additionally, the processing device 990 may include any combination of general-purpose processing device(s) and special-purpose processing device(s).

In one embodiment, one or more processing devices, such as processing device 690, may be used in a master/slave configuration. For example, one processing device may operate as the master and one or more processing devices may operate as the slave(s). The processing devices may be configured so that the master provides a clock signal and start of scan signal to the slaves, which perform a scan of a touch sensor device, such as for example, touch-sensor pad 920. The results of the scan may be sent back to the master. In other embodiments, another processing device is used to control operation of the master and slaves and stores the results of the scans. The master/slave configuration may be effective when the touch-sensor pad 920 is relatively large by having many parallel channels (e.g., 8 channels per chip).

It should be noted that the embodiments described herein are not limited to having a configuration of a processing device coupled to a host, but may include a system that measures the capacitance on the touch-sensing device and sends the new data to a host computer where it is analyzed by an application. In effect, the processing that is done by processing device 990 may also be done (in whole or in part) in the host.

In one embodiment, the method and apparatus described herein may be implemented in a fully self-contained touch-sensor pad, which outputs fully processed x/y movement and gestures data signals or data commands to a host. In an alternative embodiment, the method and apparatus may be implemented in a touch-sensor pad, which outputs x/y movement data and also finger presence data to a host, and where the host processes the received data to detect gestures. In another embodiment, the method and apparatus may be implemented in a touch-sensor pad, which outputs raw capacitance data to a host, where the host processes the capacitance data to compensate for quiescent and stray capacitance, and calculate x/y movement and detects gestures by processing the capacitance data. Alternatively, the method and apparatus may be implemented in a touch-sensor pad, which outputs pre-processed capacitance data to a host, where the touch-sensor pad processes the capacitance data to compensate for quiescent and stray capacitance, and the host calculate x/y movement and detects gestures from the pre-processed capacitance data.

In one embodiment, the electronic system that includes the embodiments described herein may be implemented in a conventional laptop touch-sensor pad. Alternatively, it may be implemented in a wired or wireless keyboard integrating a touch-sensor pad, which is itself connected to a host. In such an implementation, the processing described above as being performed by the "host" may be performed in part or in whole by the keyboard controller, which may then pass fully processed, pre-processed or unprocessed data to the system host. In another embodiment, the embodiments may be implemented in a mobile handset (e.g., cell phone) or other electronic devices where the touch-sensor pad may operate in one of two or more modes. For example, the touch-sensor pad may operate either as a touch-sensor pad for x/y positioning and gesture recognition, or as a keypad or other array of touch-sensor buttons and/or sliders.

Capacitive sensor 910 may be integrated into the IC of the processing device 990, or alternatively, in a separate IC. Alternatively, descriptions of capacitive sensor 910 may be generated and compiled for incorporation into other integrated circuits. For example, behavioral level code describing capacitive sensor 910, or portions thereof, may be generated using a hardware descriptive language, such as VHDL or Verilog, and stored to a machine-accessible medium (e.g., CD-ROM, hard disk, floppy disk, or the like). Furthermore, the behavioral level code can be compiled into register transfer level ("RTL") code, a netlist or even a circuit layout and stored to a machine-accessible medium. The behavioral level code, the RTL code, the netlist and the circuit layout all represent various levels of abstraction to describe capacitive sensor 910.

It should be noted that the components of electronic system 900 may include all the components described above. Alternatively, electronic system 900 may include only some of or more than the components described above.

In one embodiment, electronic system 900 may be used in a notebook computer. Alternatively, the electronic system 900 may be used in other applications, such as a mobile handset, a personal data assistant (PDA), a keyboard, a television, a remote control, a monitor, a handheld multi-media device, a handheld video player, a handheld gaming device, a control panel, or other suitable type of device, application, or system.

In one embodiment, capacitive sensor 910 may be a capacitive sensor relaxation oscillator (CSR). The CSR may have an array of capacitive touch switches using a current-programmable relaxation oscillator, an analog multiplexer, digital counting functions and high-level software routines to compensate for environmental and physical switch variations. The switch array may include combinations of independent switches, sliding switches (e.g., touch-sensor slider), and touch-sensor pads implemented as a pair of orthogonal sliding switches. The CSR may include physical, electrical, and software components. The physical component may include the physical switch itself, typically a pattern constructed on a printed circuit board (PCB) with an insulating cover, a flexible membrane or a transparent overlay. The electrical component may include an oscillator or other means to convert a changed capacitance into a measured signal. The electrical component may also include a counter or timer to measure the oscillator output. The software component may include detection and compensation software algorithms to convert the count value into a switch detection decision. For example, in the case of slide switches or X-Y touch-sensor pads, a calculation for finding position of the conductive object to greater resolution than the physical pitch of the switches may be used.

It should be noted that there are various known methods for measuring capacitance. Although the embodiments described herein are described using a relaxation oscillator, the present embodiments are not limited to using relaxation oscillators, but may include other methods, such as current versus voltage phase shift measurement, resistor-capacitor charge timing, capacitive bridge divider, charge transfer, or the like.

In one method, the current versus voltage phase shift measurement may include driving the capacitance through a fixed-value resistor to yield voltage and current waveforms that are out of phase by a predictable amount. The drive frequency can be adjusted to keep the phase measurement in a readily measured range. In another method, the resistor-capacitor charge timing may include charging the capacitor through a fixed resistor and measuring timing on the voltage ramp. Small capacitor values may require very large resistors for reasonable timing. In an alternative method, the capacitive bridge divider may include driving the capacitor under test through a fixed reference capacitor. The reference capacitor and the capacitor under test form a voltage divider. The voltage signal is recovered with a synchronous demodulator, which may be done in the processing device 990. In another method, the charge transfer may be conceptually similar to an R-C charging circuit. In this method, $C_p$ is the capacitance being sensed. $C_{SUM}$ is the summing capacitor, into which charge is transferred on successive cycles. At the start of the measurement cycle, the voltage on $C_{SUM}$ is reset. The voltage on $C_{SUM}$ increases exponentially (and only slightly) with each clock cycle. The time for this voltage to reach a specific threshold is measured with a counter. Additional details regarding these alternative embodiments have not been included so as to not obscure the present embodiments, and because these alternative embodiments for measuring capacitance are known by those of ordinary skill in the art.

Embodiments of the present invention include various operations described herein. These operations may be performed by hardware components, software, firmware, or a combination thereof. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a machine-readable medium. These instructions may be used to program a general-purpose or special-purpose computer or processor to perform the described operations. A machine-readable medium includes any mechanism for storing or transmitting information in a form (e.g., software, processing application) readable by a machine (e.g., a computer). The machine-readable medium may include, but is not limited to, magnetic storage medium (e.g., floppy diskette), optical storage medium (e.g., CD-ROM), magneto-optical storage medium, read-only memory (ROM), random-access memory (RAM), erasable programmable memory (e.g., EPROM and EEPROM), flash memory, or another appropriate type of medium suitable for storing electronic instructions.

Additionally, some embodiments may be practiced in distributed computing environments where the machine-readable medium is stored on and/or executed by more than one computer system. In addition, the information transferred between computer systems may either be pulled or pushed across the communication medium connecting the computer systems.

The digital processing devices described herein may include one or more general-purpose processing devices such as a microprocessor or central processing unit, a controller, or the like. Alternatively, the digital processing device may include one or more special-purpose processing devices such as a digital signal processor (DSP), an application specific integrated circuit (ASIC), a field programmable gate array (FPGA), or the like. In an alternative embodiment, for example, the digital processing device may be a network processor having multiple processors including a core unit and multiple microengines. Additionally, the digital processing device may include any combination of general-purpose processing devices and special-purpose processing devices.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

What is claimed is:

1. A method implemented by a computing device programmed to perform the following, the method comprising:
   measuring a current across a sense capacitor;
   conveying the current to a charge storage circuit to generate a first output voltage signal and a second output voltage signal; and
   detecting a presence of a conductive object proximate to the sense capacitor based on a difference between the first output voltage signal and the second output voltage signal.

2. The method of claim 1, further comprising:
   alternately driving a first electrode of the sense capacitor with a high supply voltage and a low supply voltage; and
   holding a second electrode of the sense capacitor at a fixed voltage level, wherein the second electrode is coupled to a current conveyor that conveys the current to the charge storage circuit.

3. The method of claim 1, wherein the charge storage circuit comprises a capacitor circuit.

4. The method of claim 1, wherein the charge storage circuit comprises a quasi-differential capacitor circuit comprising a positive integration capacitor and a negative integration capacitor.

5. The method of claim 4, further comprising:
   pre-charging the positive integration capacitor to a first voltage level; and
   pre-charging the negative integration capacitor to a second voltage level.

6. The method of claim 4, further comprising:
   mirroring the current across the sense capacitor at an output of a current conveyor that conveys the current to the charge storage circuit.

7. The method of claim 6, wherein storing the charge from the current comprises:
   charging the positive integration capacitor when the current at the output of the current conveyor is positive; and
   discharging the negative integration capacitor when the current at the output of the current conveyor is negative.

8. The method of claim 4, further comprising:
   outputting a voltage level stored on the positive integration capacitor to a processing circuit as the first output voltage signal; and
   outputting a voltage level stored on the negative integration capacitor to the processing circuit as the second output voltage signal.

9. The method of claim 8, further comprising:
   performing one or more subconversions to output the voltage levels stored on the positive and negative integration capacitors to the processing circuit; and
   accumulating results of the one or more subconversions to determine a total change in capacitance.

10. An apparatus comprising:
    a capacitive sensing device;
    a current conveying circuit coupled to the capacitive sensing device; and
    a charge storage circuit coupled to the current conveying circuit, wherein the charge storage circuit is configured to generate a first output voltage signal and a second output voltage signal while a current is conveyed to the charge storage circuit for a detection of a presence of a conductive object proximate to the capacitive sensing device, based on a difference between the first output voltage signal and the second output voltage signal.

11. The apparatus of claim 10, wherein the current conveying circuit comprises a low impedance input coupled to an electrode of the capacitive sensing device, the low impedance input configured to hold the electrode at a fixed voltage level.

12. The apparatus of claim 11, wherein the current conveying circuit comprises:
    a positive bipolar output coupled to the charge storage circuit, the positive bipolar output configured to mirror a current sensed at the low-impedance input; and
    a negative bipolar output, the negative bipolar output to invert the current sensed at the low-impedance input.

13. The apparatus of claim 12, wherein the charge storage circuit comprises an integration capacitor coupled between an output node and a ground node.

14. The apparatus of claim 13, wherein the charge storage circuit further comprises a second integration capacitor coupled between the output node and the ground node.

15. The apparatus of claim 12, wherein the charge storage circuit comprises a quasi-differential capacitor circuit, the quasi-differential capacitor circuit comprising a first integration capacitor coupled between a first output node and a ground node and a second integration capacitor coupled between a second output node and the ground node.

16. The apparatus of claim 15, further comprising a synchronous detect circuit coupled to the charge storage circuit, the synchronous detect circuit configured to charge the first integration capacitor when the current at the bipolar output is positive and to discharge the second integration capacitor when the current is negative.

17. The apparatus of claim 10, further comprising a processing circuit coupled to the charge storage circuit, the processing circuit configured to detect the presence of the conductive object based on the first output voltage signal and the second output voltage signal.

18. An apparatus comprising:
- means for measuring a capacitance of a capacitive sensor device;
- means for conveying a charge from the capacitance to a charge storage circuit to generate a first output voltage signal and a second output voltage signal; and
- means for detecting a presence of a conductive object proximate to the capacitive sensor device based on a difference between the first output voltage signal and the second output voltage signal.

19. The apparatus of claim 18, where the capacitive sensor device comprises a mutual capacitance sensor device.

20. The apparatus of claim 18, wherein the charge storage circuit comprises a quasi-differential capacitor circuit comprising a first integration capacitor and a second integration capacitor.

* * * * *